(12) United States Patent
Suzuki

(10) Patent No.: US 9,203,027 B2
(45) Date of Patent: Dec. 1, 2015

(54) COATING METHOD AND MANUFACTURING METHOD OF ORGANIC EL DISPLAY

(75) Inventor: Naoki Suzuki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 109 days.

(21) Appl. No.: 13/150,628

(22) Filed: Jun. 1, 2011

(65) Prior Publication Data

US 2011/0300289 A1 Dec. 8, 2011

(30) Foreign Application Priority Data

Jun. 2, 2010 (JP) ................................ 2010-126480
Apr. 25, 2011 (JP) ................................ 2011-097384

(51) Int. Cl.
| | | |
|---|---|---|
| *C23C 16/52* | (2006.01) | |
| *B05D 5/12* | (2006.01) | |
| *H01L 51/00* | (2006.01) | |
| *H01L 27/32* | (2006.01) | |
| *H01L 51/56* | (2006.01) | |

(52) U.S. Cl.
CPC ......... *H01L 51/0005* (2013.01); *H01L 27/3211* (2013.01); *H01L 51/56* (2013.01)

(58) Field of Classification Search
USPC ....................................................... 427/66, 8
See application file for complete search history.

(56) References Cited

U.S. PATENT DOCUMENTS

| | | | |
|---|---|---|---|
| 2003/0011727 A1 | 1/2003 | Kiguchi et al. | |
| 2005/0005996 A1 | 1/2005 | Mizutani | |
| 2006/0290914 A1 | 12/2006 | Van Der Pasch et al. | |
| 2008/0152880 A1 | 6/2008 | Kinoshita | |
| 2008/0225067 A1 | 9/2008 | Morino et al. | |
| 2009/0110420 A1* | 4/2009 | Sheflin et al. | 399/49 |
| 2009/0115808 A1* | 5/2009 | Tanaka | 347/14 |
| 2010/0156976 A1* | 6/2010 | Seo et al. | 347/14 |
| 2011/0269255 A1* | 11/2011 | Goddard et al. | 438/46 |

FOREIGN PATENT DOCUMENTS

| | | |
|---|---|---|
| CN | 1393704 | 1/2003 |
| CN | 101204875 | 6/2008 |
| JP | 2003-107238 | 4/2003 |
| JP | 2003-251243 | 9/2003 |
| JP | 2003-266669 | 9/2003 |
| JP | 2004-101218 | 4/2004 |
| JP | 2004-337725 | 12/2004 |

(Continued)

OTHER PUBLICATIONS

English Translation of Search Report which is annex to Office action dated Jan. 13, 2014 for Chinese Patent Application No. 201110147535.8.

*Primary Examiner* — Austin Murata
(74) *Attorney, Agent, or Firm* — Panasonic Patent Center

(57) ABSTRACT

A coating method in which ink droplets containing functional material are ejected through nozzles on a substrate having a plurality of pixel regions and lyophobic portions adjacent to the respective pixel regions, to form a functional layer in each of the pixel regions includes: landing an ink droplet on a first pixel region and on a first lyophobic portion adjacent to the first pixel region; measuring a deviation of a landing position of the ink droplet on the first lyophobic portion from a set ink landing position; and ejecting an ink droplet on a second pixel region of the substrate while correcting the timing of ink ejection through the nozzles based on the deviation.

12 Claims, 17 Drawing Sheets

(56) References Cited

FOREIGN PATENT DOCUMENTS

| | | |
|---|---|---|
| JP | 2004-337726 | 12/2004 |
| JP | 2004-362818 | 12/2004 |
| JP | 2005-218918 | 8/2005 |
| JP | 2006-171365 | 6/2006 |
| JP | 2007-004175 | 1/2007 |
| JP | 2008-229917 | 10/2008 |

* cited by examiner

COATING METHOD AND MANUFACTURING METHOD OF ORGANIC EL DISPLAY

CROSS REFERENCE TO RELATED APPLICATION

This application is entitled and claims the benefit of Japanese Patent Application No. 2010-126480 filed on Jun. 2, 2010, the disclosure of which including the specification, drawings and abstract is incorporated herein by reference in its entirety.

TECHNICAL FIELD

This disclosure relates to a method of forming organic films by coating techniques, and a manufacturing method of an organic electroluminescent display (hereinafter abbreviated as an "organic EL display").

BACKGROUND ART

Organic EL displays can be broadly classified into two types according to the method by which their organic light-emitting films are formed. The first type of organic EL displays has organic light-emitting layers that are formed by vapor deposition, a technique used when low-molecular weight organic material is employed as raw material. The other type of organic EL displays has organic light-emitting layers that are formed by the coating method, a technique often used when employing high-molecular organic material as raw material, as well as when employing low-molecular weight organic material as raw material.

One of the representative approaches used to form organic light-emitting layers by the coating technique is a method that ejects ink droplets containing organic luminescent material by means of an inkjet apparatus on pixel regions of a display substrate to form organic light-emitting layers (see, e.g., Patent Literature 1). The ink droplets contain an organic luminescent material and a solvent.

An inkjet apparatus, which includes an inkjet head having a plurality of nozzles, ejects ink droplets through the nozzles while controlling the positional relationship between the nozzles and the substrate (see, e.g., Patent Literature 2). Patent Literature 2 discloses that droplets jetted onto a substrate are configured to equally spread to form a linear pixel with a given width.

Pixel regions of a display substrate on which droplets are to be ejected are often defined by partitioning walls called a bank. This is for keeping the ejected ink droplets within specific pixel regions. Banks may define each pixel region one by one, but may define each row of pixel regions of the same color (e.g., red (R), green (G) or blue (B)) one by one (see Patent Literature 3). In some cases, banks that define rows of pixel regions are called linear banks. That is, a red, green or blue organic light-emitting layer is formed in each of the regions defined by linear banks (hereinafter may also referred to as a "linear region").

Pixel regions to be coated with ink are 40 to 60 um in size; therefore, failure to precisely eject ink droplets results in coating position misalignment. Coating position misalignment causes color mixing between adjacent pixel regions and/or layer thickness variation. As a technique for achieving precise inkjet printing, a method is disclosed in which a test coating operation is first conducted by ejecting ink droplets through all nozzles to create a test print pattern, followed by measurement of the landing position of the ink droplets on the test print pattern and by correction of the ink ejection position using the measured landing position (see, e.g., Patent Literature 4).

The technology disclosed in Patent literature 4 will be described with reference to FIG. 15. FIG. 15 illustrates microarray fabrication apparatus 90 that includes imaging means 30, drive control means 40, stage 50, carriage (head) 60, table 70, and cartridge 80. A plurality of substrates 100 as coatings target, is placed on table 70. Substrates 100 include a test substrate. Through all nozzles of microarray fabrication apparatus 90, liquid droplets are first ejected onto a test substrate to create (draw) thereon test print pattern 300; the landing position of the liquid droplets on test print pattern 300 is determined; and the ink landing position for the next ink ejection is corrected based on the measurement. In this way a microarray is fabricated on substrate 100.

Another known technique for achieving precise inkjet printing is a method in which a pattern for correcting coating position misalignment is created on a water-repellent sheet set apart from a coating target, followed by reading of the misalignment correction pattern and by correction of the target coating position based on the reading (see Patent Literature 5).

An additional known technique for achieving precise inkjet printing involves placement of an alignment mark at a non-coating region beside a coating region of the substrate to be coated (see Patent Literatures 6 and 7). The alignment mark placed on the substrate is then captured by a camera, calculating the position for the next ink ejection based on the position of the alignment mark. Ink is then applied on the substrate.

CITATION LIST

| Patent Literature | |
|---|---|
| [Patent Literature 1] | Japanese Patent Application Laid-Open No. 2004-362818 |
| [Patent Literature 2] | Japanese Patent Application Laid-Open No. 2003-266669 |
| [Patent Literature 3] | Japanese Patent Application Laid-Open No. 2005-218918 |
| [Patent Literature 4] | Japanese Patent Application Laid-Open No. 2004-101218 |
| [Patent Literature 5] | Japanese Patent Application Laid-Open No. 2008-229917 |
| [Patent Literature 6] | Japanese Patent Application Laid-Open No. 2004-337725 |
| [Patent Literature 7] | Japanese Patent Application Laid-Open No. 2007-4175 |

Technical Problem

There are two possible causes of ink droplets landing on positions different from what is intended during inkjet printing. The first cause is derived from the substrate to be coated as a coating target, i.e., lot-to-lot variation in size or size variation due to thermal expansion. In particular, the larger the coating area of the coating target (substrate), the larger the lot-to-lot size variation or size variation due to thermal expansion. The second cause is derived from the inkjet apparatus itself, i.e., misalignment of the substrate transfer mechanism or inkjet head transfer mechanism during operation, or misalignment of an inkjet head attachment unit due to thermal expansion during operation.

With the method disclosed by Patent Literature 4 or 5, prior to the coating of a target with ink, a test print pattern is created on a test region, or a pattern for correcting coating position misalignment is created on a separate test sheet, respectively, and then ink is ejected on the target after correcting the ink landing position based on the test print pattern. That is, correction of ink landing position is made before a coating process. Accordingly, with the methods disclosed by Patent Literatures 4 and 5, coating position misalignment cannot be corrected during coating process.

Similarly, even when an alignment mark is placed on a substrate as with the method disclosed by Patent Literature 6 or 7, coating position misalignment caused by lot-to-lot variation in substrate size or misalignment of coater parts cannot be corrected. More specifically, when the positional relationship between the substrate's center point and the alignment mark changed due to temperature changes of the substrate, correction of coating position misalignment will fail.

In fact, when coating a 370 mm×470 mm substrate by the inkjet printing, the actual ink landing position may deviate by several tens of micrometers from the intended position. It is anticipated that this deviation will become large along with recent increases in the size of coating targets.

SUMMARY

In view of the foregoing problems, it is an object of the embodiments of the present invention to provide an inkjet coating method that can correct coating position misalignment caused not only by lot-to-lot variation in substrate (coating target) size or substrate size variation due to thermal expansion, but also by misalignment of parts of the inkjet coater itself. In particular, embodiments of the present invention provide a coating method that can also precisely coat large-area substrates with inkjet technology, which show large lot-to-lot variation in size or large size variation due to thermal expansion.

The coating method according to the first aspect is a coating method in which ink droplets containing functional material are ejected through nozzles on a substrate having a plurality of pixel regions and lyophobic portions adjacent to the respective pixel regions, to form a functional layer in each of the pixel regions, the method including: landing an ink droplet on a first pixel region and on a first lyophobic portion adjacent to the first pixel region; measuring a deviation of a landing position of the ink droplet on the first lyophobic portion from a set ink landing position; and ejecting an ink droplet on a second pixel region of the substrate by correcting the timing of ink ejection through the nozzles based on the measured deviation.

With this coating method according to the first aspect, it is possible to precisely apply ink on pixel regions.

The coating method according to the second aspect is the coating method according to the first aspect above, and further including capturing an image containing the ink droplet which landed on the first lyophobic portion and the first pixel region, and measuring the deviation using the captured image.

The coating method according to the third aspect is the coating method according to the first aspect above, wherein the first pixel region includes one or more sub-pixels.

The coating method according to the fourth aspect is the coating method according to the first aspect above, wherein the first pixel region is a linear region including a plurality of sub-pixels to which the same ink is applied, and the first lyophobic portion is adjacent to a lengthwise end of the first pixel region.

The coating method according to the fifth aspect is the coating method according to the first aspect above, wherein the first pixel region is a linear region including a plurality of sub-pixels to which the same ink is applied, the first lyophobic portion includes two lyophobic portions positioned adjacent to either lengthwise end of the first pixel region, and the method further includes measuring a deviation between a landing position of the ink droplet on one of the two lyophobic portions and a landing position of the ink droplet on the other lyophobic portion, and correcting the timing of ink ejection through the nozzles based on the deviation.

The coating method according to the sixth aspect is the coating method according to the first aspect above, wherein the first pixel region is a linear region including a plurality of sub-pixels to which the same ink is applied, and the first lyophobic portion is adjacent to a widthwise end of the first pixel region.

The present invention further concerns a manufacturing method of an organic EL display in which ink droplets containing functional material are ejected through nozzles on a display substrate having a plurality of pixel regions and lyophobic portions adjacent to the respective pixel regions, to form an organic functional layer in each of the pixel regions, the method including: landing an ink droplet on a first pixel region and on a first lyophobic portion adjacent to the first pixel region; measuring a deviation of a landing position of the ink droplet on the first lyophobic portion from a set ink landing position; and ejecting an ink droplet on a second pixel region of the substrate while correcting the timing of ink ejection through the nozzles based on the deviation.

With the coating method of the above embodiments of the present invention, an ink droplet is ejected on a first pixel region and on a first lyophobic portion by the inkjet printing, and ink is ejected on a second pixel region while correcting the timing of ink ejection on the second pixel region based on a deviation of the landing position of the ink droplet on the first lyophobic portion from a set ink landing position. As a result, ink can be precisely applied on pixel regions even when 1) there is lot-to-lot variation in substrate size or substrate size variation due to thermal expansion; 2) misalignment of the substrate transfer mechanism or inkjet head transfer mechanism occurs during operation, or misalignment of an inkjet head attachment unit occurs due to thermal expansion during operation. It is thus possible to provide a high-quality organic EL display free from color mixing.

DETAILED DESCRIPTION OF PREFERRED EMBODIMENTS

Figure 1:
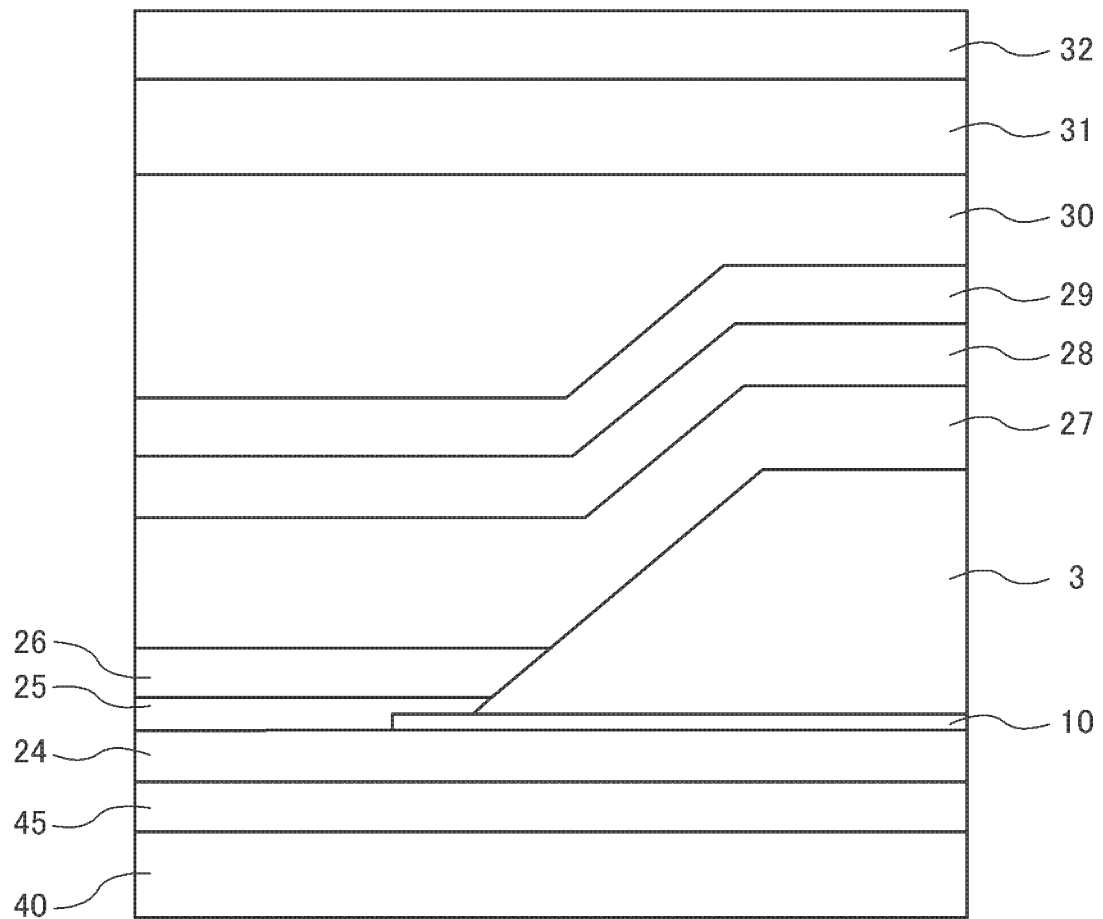
FIG. 1 is a schematic illustration of laminated layers constituting a light-emitting device of an organic EL display.

The coating method of embodiments of the present invention ejects ink droplets containing functional material onto a substrate provided with a plurality of pixel regions and a lyophobic portion adjacent to each of the pixel regions, so as to form functional films in the respective pixel regions.

The substrate as a coating target includes on its surface a plurality of pixel regions and a lyophobic portion adjacent to each of the pixel regions. The pixel region is preferably partitioned by a bank. Any material can be employed as bank material as long as it is insulating; resin or inorganic material such as glass may be used. Preferably, resins used as bank material are insulating resins that offer high heat resistance and heat solvent resistance; examples include polyimide resins.

As used herein the term "substrate" typically means a display panel substrate, preferably a substrate for an organic EL display panel. In such a display panel substrate, TFT devices corresponding to respective sub-pixels may be incorporated.

Each pixel region includes one or more sub-pixels. A pixel region in which one sub-pixel is disposed is referred to as a single pixel region. A pixel region in which more than one sub-pixel is disposed is referred to as a linear pixel region. Ink droplets are ejected on pixel regions by the inkjet printing, whereby the pixel regions are coated with ink. The coating surface of the pixel region is preferably made hydrophilic, and the contact angle of ink to the coating surface is preferably 5° or less.

The substrate to be coated includes pixel regions and a lyophobic portion adjacent thereto. The lyophobic portion may be a surface of bank that defines a pixel region. Ink droplets are also ejected on the lyophobic portion as will be described later. Preferably, the ink droplet landed on the lyophobic portion retains the same form as it is landed thereon without spreading over the lyophobic portion. This prevents intrusion of ink landed on the lyophobic portion into pixel regions, as well as allows for precise confirmation of the landing position of the ink droplet on the lyophobic portion. Thus, the contact angle of ink to the lyophobic portion is preferably 30° or larger; for example, it is set at 40°.

It is only necessary that the lyophobic portion is positioned adjacent to a pixel region. In the case of a single pixel region, the lyophobic portion may be a surface of bank immediately beside the single pixel region. In the case of a linear pixel region, the lyophobic portion may be either 1) a surface of bank adjacent to one or either lengthwise end of the linear pixel region, or 2) a surface of bank adjacent to the widthwise ends of the linear pixel region.

Ink to be applied on pixel regions of a substrate contains functional material, such as organic functional material. When an embodiment of the present invention is used for the manufacture of an organic EL display, ink is a solution of organic luminescent material or charge transport material; with the coating method of the embodiment of the present invention, it is possible to form organic light-emitting layers or charge transport layers for an organic EL display.

Organic luminescent material to be added in ink may be either low-molecular weight or polymeric organic luminescent material. In general, precise inkjet printing is difficult with ink that contains polymeric luminescent material; therefore, the method of the embodiment of the present invention is effectively used when using polymeric luminescent material. Examples of polymeric organic EL material include polyphenylenevinylene (PPV) and its derivatives, polyacetylene and its derivatives, polyphenylene and its derivatives, poly para phenylene ethylene and its derivatives, poly(3-hexylthiophene) (P3HT) and its derivatives, and polyfluorene (PF) and its derivatives.

The coating method of the embodiment of the present invention for forming functional layers includes: 1) landing an ink droplet on a first pixel region and on a first lyophobic portion positioned adjacent to the first pixel region of a substrate; 2) measuring a deviation from the landing position of the ink droplet on the first lyophobic portion from a set ink landing position; 3) ejecting an ink droplet on a second pixel region of the substrate after or while correcting the ink ejection timing based on the deviation.

In the coating method of the embodiment of the present invention, pixel regions of a substrate are sequentially coated with ink along the scanning direction while moving an inkjet head of an inkjet apparatus across the substrate. Specifically, after coating the first pixel region, the inkjet head is moved along the scanning direction for coating the second pixel region.

In 1) of the coating method, at the time of coating the first pixel region, an ink droplet is landed also on the first lyophobic portion positioned adjacent to the first pixel region. The ink droplet landed on the lyophobic portion is preferably distant from the pixel region by 20 to 150 p.m. When the distance between the ink droplet landed on the lyophobic portion and the pixel region is excessively small, there is concern that the ink droplet landed on the lyophobic portion moves into the pixel region. On the other hand, when the distance is excessively large, there is concern that proper correction fails as will be described below.

There are no particular limitations on the number of ink droplets to be landed on the first lyophobic portion; one ink droplet will suffice. Alternatively, two or more ink droplets may be landed.

As described above, upon coating pixel regions of a substrate, ink droplets are also landed on lyophobic portions adjacent to the respective pixel regions. At this time, ink droplets may be landed on lyophobic regions of some or all of the pixel regions of the substrate.

Ejection of ink droplets by the inkjet printing may be accomplished by means of an inkjet apparatus. There are no particular limitations on the frequency at which ink is ejected through the nozzles of the inkjet head of an inkjet apparatus; it is appropriately determined depending on the specification and the like of an organic EL display being manufactured. The ink ejection frequency can be 10 kHz, for example.

There are also no particular limitations on the viscosity of ink to be ejected; it is preferably within a range from about 5 to about 20 mPa·s. Ink viscosity can be 10 mPa·s, for example.

Moreover, there are no particular limitations on the ink dot density. Ink dot density in the scanning direction may be set to 4,800 dpi, for example. Ink dot density is appropriately determined depending on the specification and the like of an organic EL display to be manufactured.

The volumes of ink droplets ejected through nozzles of the inkjet head are preferably uniform among the nozzles. There are no particular limitations on the volume of an ink droplet ejected through each nozzle; it is preferably within a range of 1 to 15 pl (picoliter). One ink droplet volume can be 5 pl, for example.

In 2) of the coating method, a deviation from the landing position of an ink droplet on the first lyophobic portion from a set ink landing position is measured. Measurement may be accomplished by taking an image that contains an ink droplet landed on the first lyophobic portion and the first pixel region, and measuring the deviation of the landing position of the ink droplet with respect to the first pixel region.

In the case of a linear pixel region, when an ink droplet has been landed on two lyophobic portions (lyophobic portions X and Y) adjacent to either lengthwise end of the linear pixel region, a deviation of the landing position of the ink droplet from the set ink landing position is measured for each of lyophobic portions X and Y. When any difference is found with regard to the deviation amount for lyophobic portion X and that for lyophobic portion Y, it is understood that nozzles in the inkjet head are not aligned parallel to the row of sub-pixels in the linear pixel region. To solve this problem, the alignment of the inkjet head is preferably adjusted.

In 3) of the coating method, the inkjet head is moved from the first pixel region to the second pixel region, where ink droplets are ejected to coat the second pixel region. When the landing position of the ink droplet on the first lyophobic portion matches the set ink landing position, ink droplets may be ejected on the second pixel region without correcting the ink ejection timing. On the other hand, when the landing position of the ink droplet on the lyophobic portion adjacent to the first pixel region does not match the set ink landing position, the timing of ink ejection on the second pixel region is corrected. For example, when the landing position of the ink droplet on the first lyophobic portion is upstream of the set ink landing position with respect to the scanning direction, the ink ejection timing may be delayed for coating the second pixel region. In this way, it is possible to precisely apply ink on the second pixel region.

Upon applying ink on the second pixel region, an ink droplet also may be landed on a second lyophobic portion positioned adjacent to the second pixel region, for measuring a deviation from the set ink landing position. The timing of ink ejection on the third pixel region may then be corrected based on the deviation measured. By repeating this operation, ink can be precisely applied to all pixel regions of the substrate.

Hereinafter, preferred embodiments of the coating method for forming functional films will be described with reference to the accompanying drawings. More specifically, the preferred embodiments will be described by way of a manufacturing method of an organic EL display having organic light-emitting films (functional layers).

(Embodiment 1)

As described above, the coating method may be used for the manufacture of an organic EL display. A schematic illustration of laminated layers that constitute an organic EL device of a typical organic EL display is depicted in FIG. 1. It should be noted that the relative layer thicknesses and layer shapes in FIG. 1 are for simple illustrative purposes only, not indicative of actual layer thicknesses or actual layer shapes.

In an organic EL device illustrated in FIG. 1, reflective anode 45 and hole injection layer 24 are formed over planarization film 40 provided on a base substrate, and pixel regulation layer 10 and bank 3 are formed over hole injection layer 24. Alternatively, after deposition of pixel regulation layer 10, hole injection layer 24 may be deposited on the entire surface, followed by formation of bank 3. Pixel regulation layer 10 is formed by the usual photolithographic technique. Specifically, pixel regulation layer 10 is provided by a sequence of the following steps: resist coating, mask exposure, developing, dry etching, and resist stripping.

Figure 3:
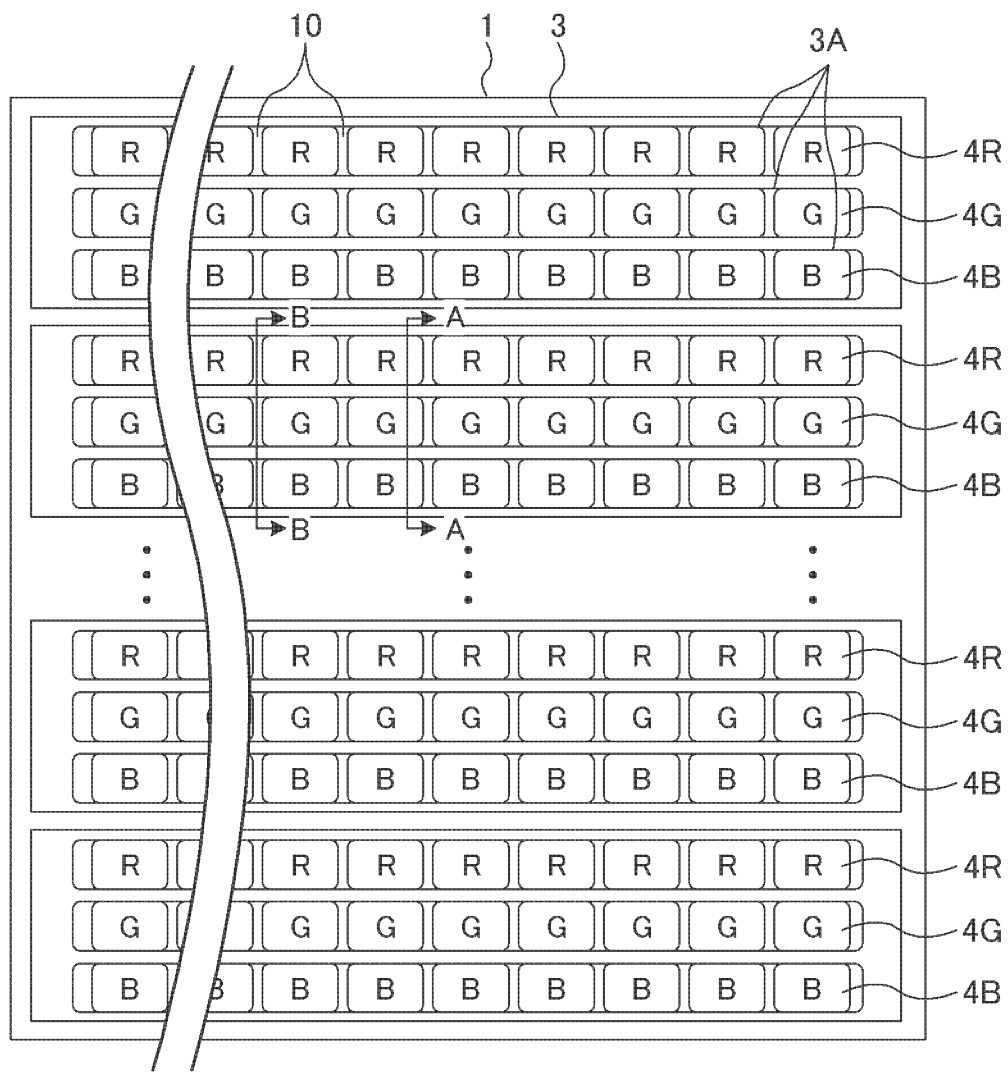
FIG. 3 is a plan view of a substrate (organic EL display panel) to be coated according to Embodiment 1.

Reflective anode 45 is prepared separately for each sub-pixel (sub-pixel R, G or B in FIG. 3). Sub-pixels are light-emitting units in a display. In a region partitioned by bank 3, inter layer (IL) 25 and organic light-emitting layer 26 are formed. Electron transport layer 27, cathode 28, sealing layer 29, and resin layer 30 are disposed in such a way as to cover organic light-emitting layer 26 and bank 3. Glass substrate 31, polarizing plate 32 and other components are disposed over resin layer 30. In this way an organic EL device is manufactured.

Figure 2:
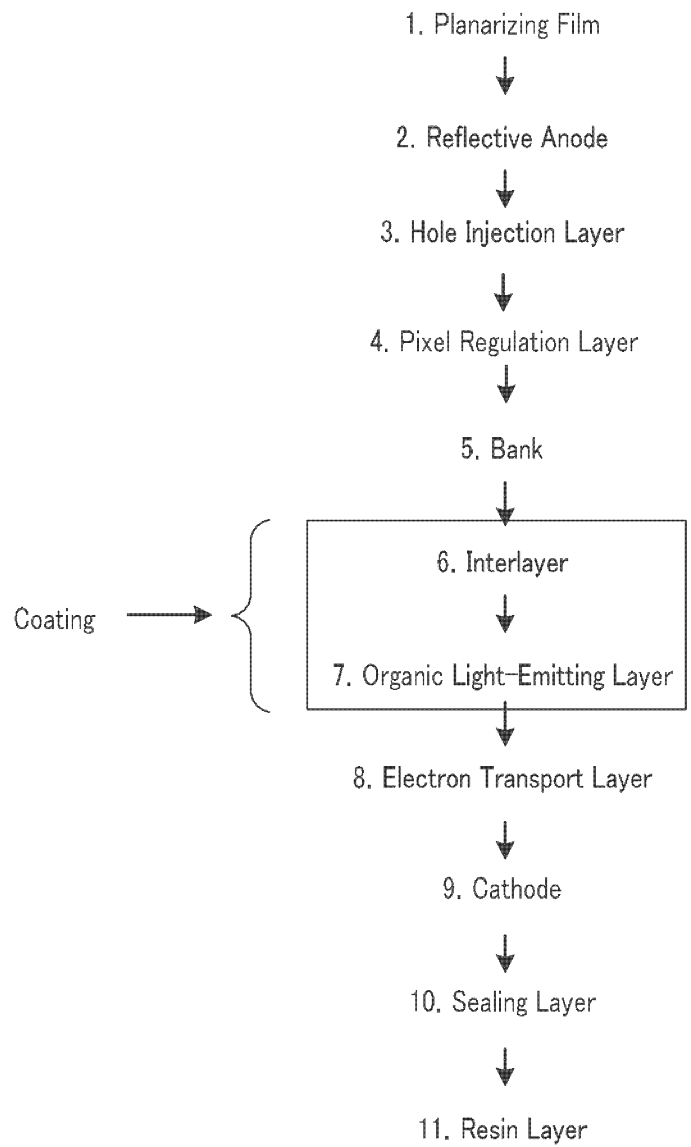
FIG. 2 is a flow chart showing a manufacturing process of an organic EL display.

The organic EL device illustrated in FIG. 1 can be manufactured in accordance with the flow chart of FIG. 2. Specifically, the organic EL device is manufactured by a sequence of the following: planarizing film formation, reflective anode formation, hole injection layer formation, pixel regulation layer formation, bank formation, inter layer formation, organic light-emitting layer formation, electron transport layer formation, cathode formation, sealing layer formation, and resin layer formation.

Preferably, the coating method of the embodiments of present invention is used for the application of ink for forming an inter layer (IL) and/or organic light-emitting layer such as those illustrated in FIG. 2.

Figure 4A:
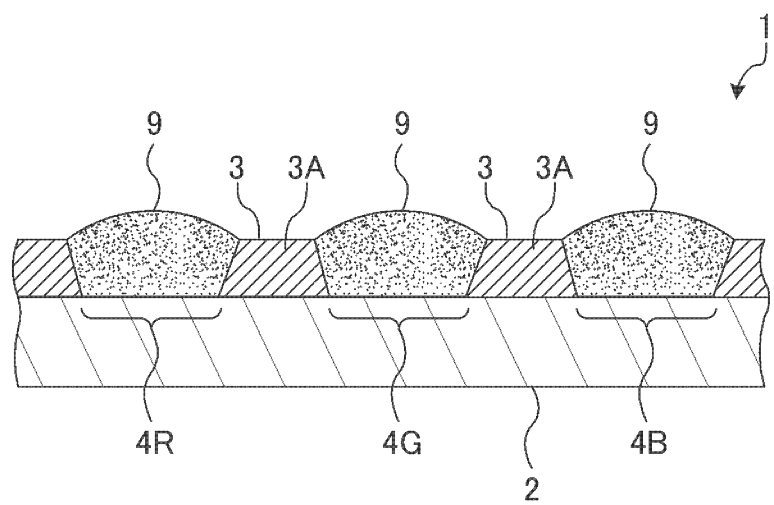
FIGS. 4A and 4B are sectional views of an organic EL display panel according to Embodiment 1, taken along lines A-A and B-B in FIG. 3, respectively.
Figure 4B:
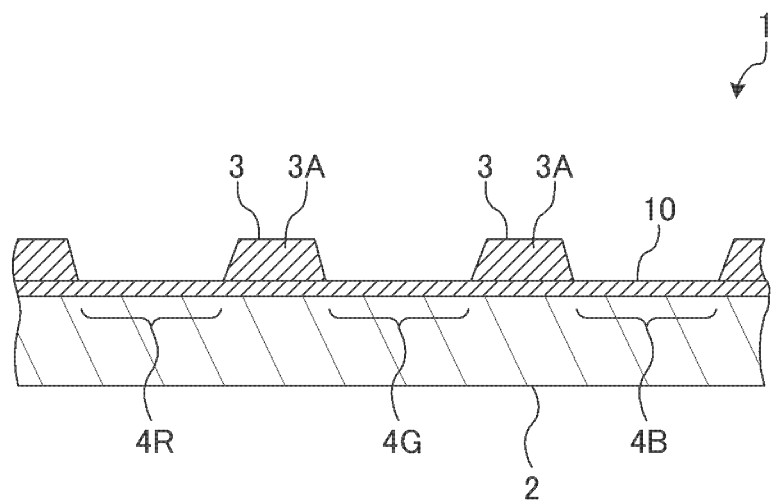

FIG. 3 is a plan view of substrate 1 (organic EL display panel) to be coated with ink that contains organic luminescent material, as seen from the above in the manufacturing process of organic EL display according to Embodiment 1. FIGS. 4A and 4B are enlarged sectional views of substrate 1 illustrated in FIG. 3. FIG. 4A is a sectional view of substrate 1 taken along line A-A in FIG. 3, and FIG. 4B is a sectional view of substrate 1 taken along line B-B in FIG. 3.

Sub-pixels (R, G, B) on substrate 1 each include essential components of an organic EL display, such as a pixel electrode (reflective anode) and a hole injection layer (see FIG. 1), but these components are omitted in FIGS. 4A and 4B.

As illustrated in FIG. 3 and FIGS. 4A and 4B, substrate 1 includes base substrate 2, pixel regions 4R, 4G and 4B disposed on base substrate 2, and bank 3 for defining the pixel regions.

As illustrated in FIG. 3, bank 3 includes a plurality of linear banks 3A that extend linearly (sideways across substrate 1 in FIG. 3). Linear banks 3A run in parallel to one another. Linear regions between adjacent linear banks 3A constitute pixel regions 4. Pixel region 4 is pixel region 4R (red), pixel region 4G (green) or pixel region 4B (blue). Pixel regions 4R, 4G and 4B are repeatedly disposed on substrate 1. In Embodiment 1, the interval between adjacent linear banks 3A is 60 nm.

Pixel region 4R includes a plurality of sub-pixels R that emit red light; pixel region 4G includes a plurality of sub-pixels G that emit green light; and pixel region 4B includes a plurality of sub-pixels B that emit blue light. Pixel regions 4R, 4G and 4B are collectively referred to as pixel regions 4.

As illustrated in FIG. 3, in pixel region 4, pixel regulation layer 10 is disposed between adjacent sub-pixels R, G or B. As measured from planarizing film 45, the height of pixel regulation layer 10 is set smaller than the height of bank 3. There are no particular limitations on the height of bank 3 and pixel regulation layer 10; the height of bank 3 from planarizing film 35 is, for example, about 1 μm, and the height of pixel regulation layer 10 from planarizing film 35 is, for example, about 100 nm. Thus, liquid ink 9 ejected to pixel region 4 partitioned by bank 3 (see FIG. 4A) can flow throughout pixel region 4 without being blocked by pixel regulation layers 10. That is, ink 9 is fed into pixel region 4 to an extent that it reaches over the height of pixel regulation layers 10 and flow throughout pixel region 4.

Pixel regulation layers 10 linearly extend in a direction perpendicular to linear banks 3A. As illustrated in FIG. 3, a plurality of linear banks 3A and a plurality of linear pixel regulation layers 10 form a grid. Pixel regulation layers 10 are made of inorganic material; examples thereof include SiON. Ink is also applied over pixel regulation layers 10 to form a functional layer.

Bank 3 may be forward tapered in section as illustrated in FIGS. 4A and 4B, or may be reverse tapered in section. Bank 3 is patterned by the photolithographic technique or the like. For example, after applying bank material, the bank material is subjected to baking, mask exposure, developing and other treatment to form bank 3 with a desired shape.

As illustrated in FIG. 4A, ink 9 is applied on pixel region 4 partitioned by bank 3. A surface of bank 3 that contacts applied ink 9 has water repellency. Bank 3 may be made water repellent by irradiation with oxygen gas plasma, or by fluorination with fluorine gas plasma or the like. Because bank 3 has water repellency, as illustrated in FIG. 4A, ink 9 filling pixel region 4 is reliably held by bank 3 so as to be accommodated in pixel region 4.

Figure 5:
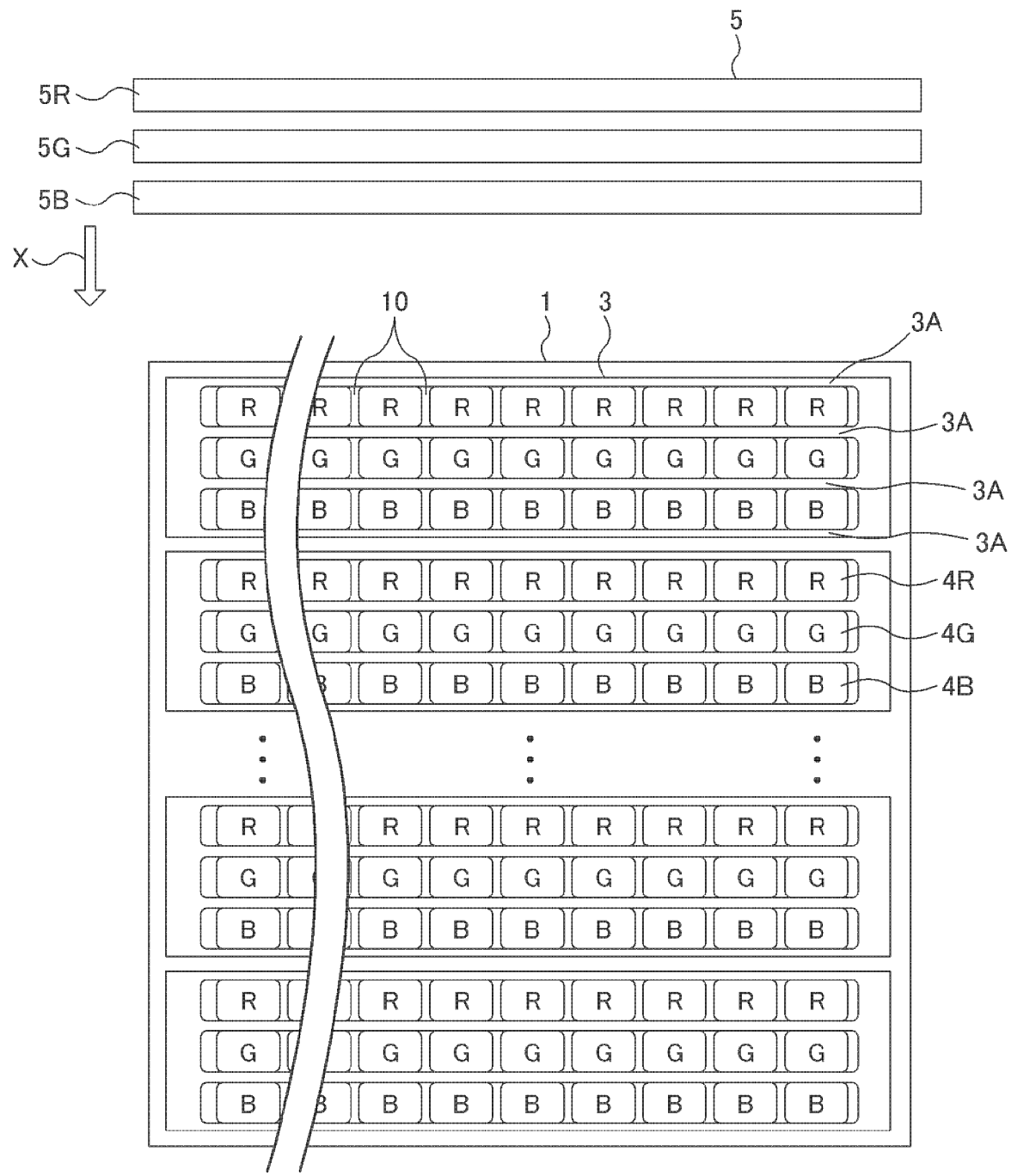
FIG. 5 illustrates a positional relationship between inkjet heads 5 and substrate 1 as well as movement direction of inkjet heads 5, in a manufacturing method of an organic EL display according to Embodiment 1.

FIG. 5 illustrates a state where ink is applied on substrate 1 of FIG. 3 by means of an inkjet apparatus. Three inkjet heads 5R, 5G and 5B (collectively referred to as "inkjet heads 5) illustrated in FIG. 5 are positioned beside substrate 1. Specifically, inkjet heads 5 are positioned beside the lengthwise side of the outermost linear bank 3A of substrate 1. Inkjet heads 5 are also positioned such that ink droplets ejected through nozzles land on pixel region 4 partitioned by bank 3.

Inkjet heads 5R, 5G and 5B store therein red ink (ink R), green ink (ink G) and blue ink (ink B), respectively. Each inkjet head includes a plurality of nozzles 6 through which ink droplets are ejected (see FIG. 6). Three separate inkjet heads 5R, 5G and 5B may be provided as illustrated in FIG. 5; alternatively, a single inkjet head that stores all of ink R, ink G and ink B may be provided. Three inkjet heads 5R, 5G and 5B illustrated in FIG. 5 have the same configuration.

Figure 6:
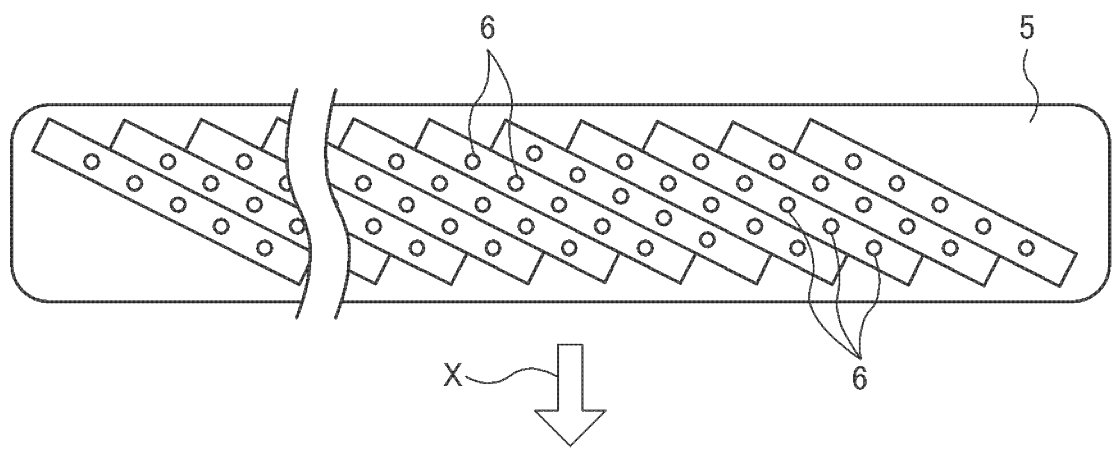
FIG. 6 illustrates an arrangement of nozzles 6 in inkjet head 5 used in a manufacturing method of an organic EL display according to Embodiment 1.

FIG. 6 illustrates a nozzle surface of inkjet head 5 (5R, 5G, 5B). A plurality of nozzles 6 is formed in the surface. Nozzles 6 of inkjet head 5 are aligned in rows that run in parallel to one another.

The rows of nozzles 6 are inclined to the scanning direction (direction indicated by arrow X in FIG. 5). By inclining the rows of nozzles 6 of inkjet head 5 to the scanning direction, the nozzle pitch perpendicular to the scanning direction can be shortened. The nozzle pitch perpendicular to the scanning direction is preferably within a range from 10 to 50 μm, about 20 μm (e.g., 21.16666 μm), for example, but there are no particular limitations on the nozzle pitch.

By shortening the nozzle pitch perpendicular to the scanning direction in this way, ink droplets ejected through nozzles 6 can be joined together as soon as they landed on the hydrophilic coating region of pixel region 4. It is thus possible to uniformly apply ink on pixel region 4 partitioned by bank 3.

As illustrated in FIG. 5, for coating substrate 1, inkjet heads 5 are relatively moved with respect to substrate 1. More specifically, inkjet heads 5 are relatively moved with respect to substrate 1 in a direction perpendicular to the extending direction of linear banks on substrate 1 (direction indicated by arrow X). The inkjet apparatus according to Embodiment 1 can apply ink over the entire surface of substrate 1 in a single pass.

The inkjet apparatus according to Embodiment 1 has a dot density of 4,800 dpi (dot per inch) in the scanning direction, and thus can eject ink droplets at a minimum pitch of 5.291667 μm in the scanning direction.

Inks R, G and B are applied on substrate 1 one after another; there are no particular limitations on the order in which they are applied. For example, inks are applied in the order of ink R, ink G and ink B. The dry thickness of the organic light-emitting layer formed in pixel region 4 is preferably about 50 nm to about 100 nm, and is 70 nm, for example.

Figure 7:
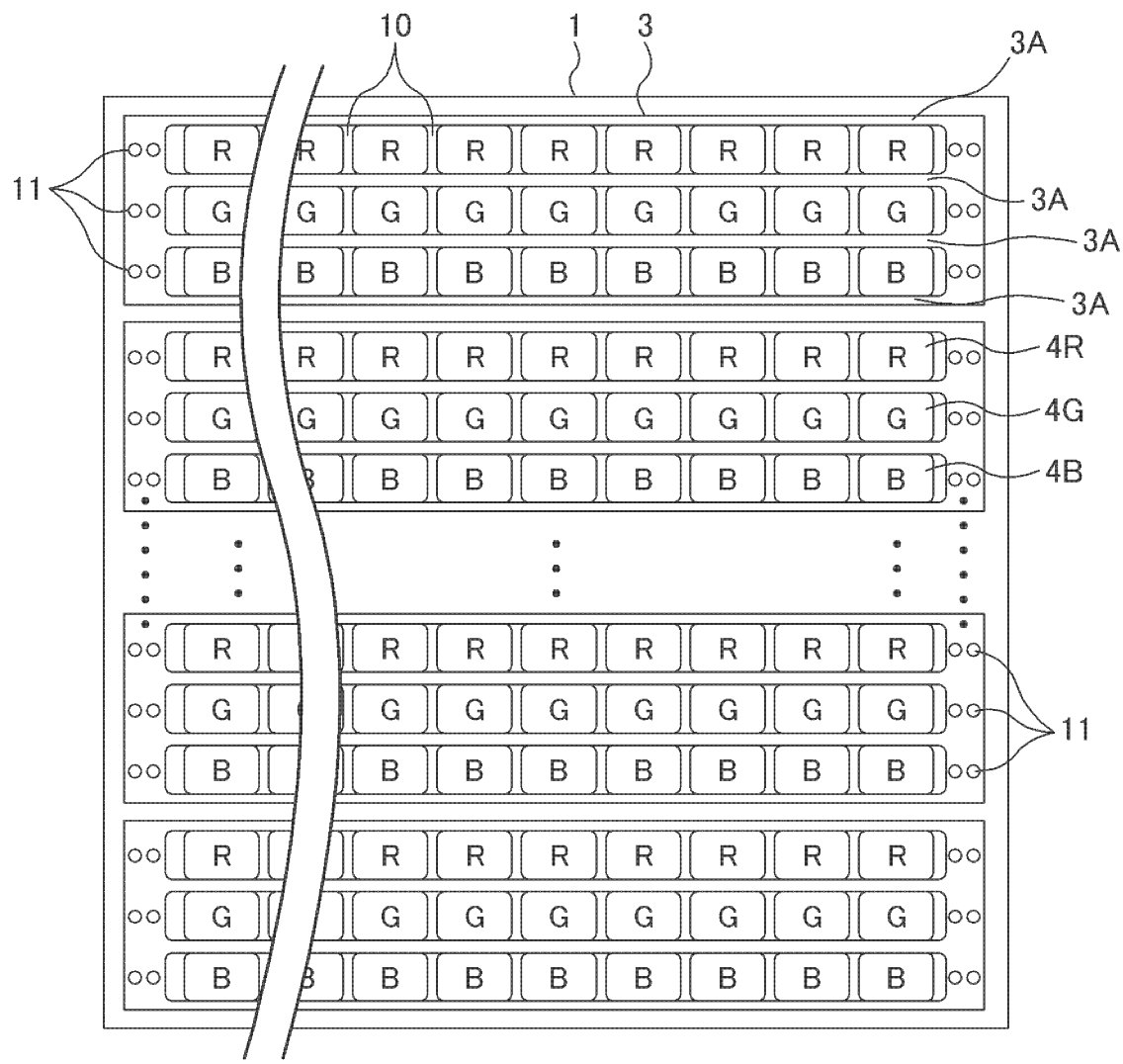
FIG. 7 is a plan view of a substrate of an organic EL display, showing ink droplets which are landed on a region adjacent to pixel regions 4.

FIG. 7 illustrates a state where ink has been applied on substrate 1 in FIG. 3 by relatively moving inkjet heads 5 (inkjet heads 5R, 5G and 5B) with respect to substrate 1. Ink is applied not only on pixel regions 4 (pixel regions 4R, 4G and 4B), but also on regions of bank 3 adjacent to either lengthwise end of each of linear pixel regions 4, i.e., lyophobic portions. Ink droplets 11 illustrated in FIG. 7 are ink droplets which are landed on the lyophobic portions. As illustrated in FIG. 7, upon applying ink in one pixel region 4, ink droplets are also landed on portions of bank 3 adjacent to either end of that pixel region 4, i.e., lyophobic portions.

Figure 8:
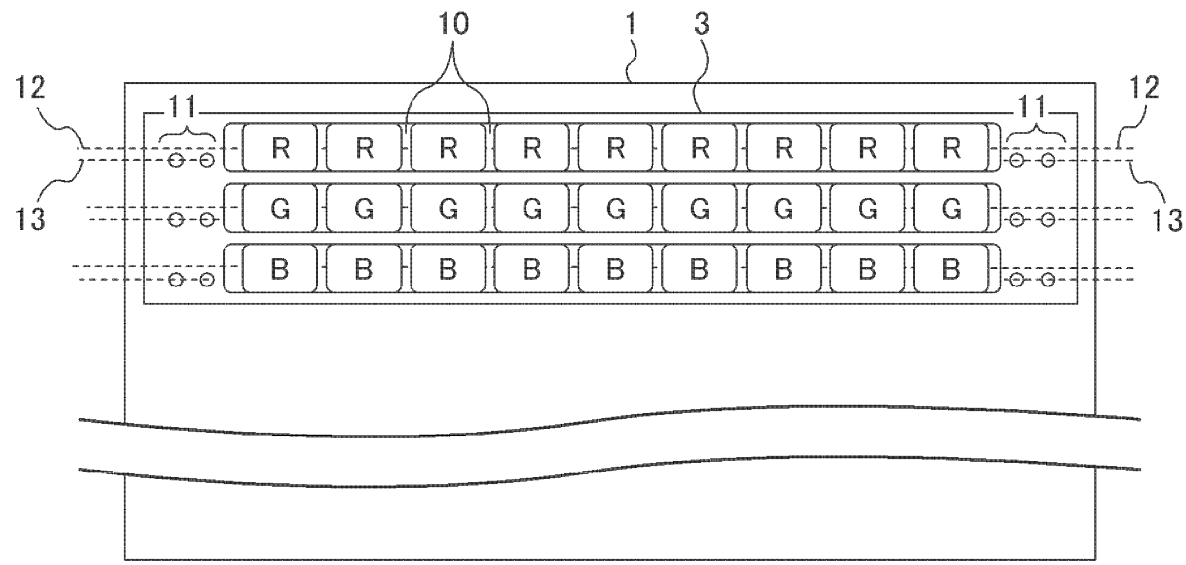
FIG. 8 is a plan view of a substrate, showing a positional relationship between the landing position of ink droplets 11 and set landing position 13.

FIG. 8 highlights the vicinity of ink droplets 11 in FIG. 7. Dotted line 13 indicates the position of ink droplets 11 with respect to the scanning direction, at which ink droplets are landed on the lyophobic portion of bank 3. Dotted line 12 indicates the intended position at which ink droplets should land (set ink landing position) with respect to the scanning direction. Dotted line 12 does not match dotted line 13—that is, it is evident that coating position misalignment occurred.

The following describes a flow in which the occurrence of coating position misalignment is prevented when ejecting ink droplets through nozzles 6 of inkjet heads 5 to form functional layers in pixel regions 4.

For applying ink on pixel regions 4 of substrate 1 by the inkjet printing, ink droplets are ejected through nozzles 6 while relatively moving inkjet heads 5 with respect to substrate 1. The scanning direction is perpendicular to the length of linear banks 3A of substrate 1, as indicated by arrow X in FIG. 5. Inkjet heads 5 (5R, 5G and 5B) are relatively moved with respect to substrate 1 such that inkjet heads 5 (5R, 5G and 5B) eject through nozzles 6 predetermined inks 9 on corresponding pixel regions 4 (4R, 4G and 4B).

As illustrated in FIGS. 7 and 8, upon coating respective pixel regions 4, ink droplets 11 are landed on lyophobic portions of bank adjacent to pixel regions 4. Two ink droplets land on each of the bank regions adjacent to pixel regions 4. By applying two or more ink droplets on bank 3, coating positions with respect to the scanning direction can be monitored easily.

Since bank 3 is lyophobic to ink 9, ink droplet 11 which have landed on bank 3 can stay at the landed position without spreading. Thus, the position of ink droplets 11 present in the bank regions adjacent to pixel regions 4 reflects the position at which they landed.

After ink has been applied on a certain pixel region 4 and ink droplets 11 has ejected on a bank region adjacent thereto (lyophobic portion), ink droplets 11 are observed for confirming the landing position (see FIG. 8). Observation may be accomplished using a microscope, and optionally, a micrograph may be taken. By this observation, it is confirmed whether or not landing position 13 of ink droplets 11 matches set landing position 12. More specifically, for example, the amount of deviation of a landing position 13 from a set landing position 12 with respect to scanning direction X is measured.

Once it is confirmed that the landing position 13 is deviated from the set landing position 12, the timing of ink ejection through nozzles of the inkjet head is corrected for coating the next pixel region 4. This makes it possible to precisely apply ink in all pixel regions 4.

As illustrated in FIGS. 7 and 8, ink droplets 11 are landed on regions of bank 3 adjacent to either lengthwise end of each pixel region 4. After landing ink droplets at either lengthwise end of one pixel region 4, the amount of deviation of the landing position of ink droplets 11 on one end from the set landing position (deviation amount a), and the amount of deviation of the landing position of ink droplets 11 on the other end from the set landing position (deviation amount β) may be measured. When any difference is found between deviation amount α and deviation amount β, that means that nozzles of the inkjet head are not aligned parallel to the length of linear pixel regions 4. It is thus made possible to correct the misaligned inkjet head based on the deviation.

As described above, with the inkjet coating method according to Embodiment 1, ink is applied on pixel region 4, and ink droplets 11 are landed on regions adjacent thereto, so that the amount of deviation of the landing position of ink droplets 11 from the set landing position is measured. In particular, it is possible to obtain the amount of deviation of the actual landing position from the set landing position in terms of the scanning direction. Based on the deviation amount thus measured, the timing of ink ejection for the next pixel region 4 is corrected. By repeating this operation, ink can be precisely applied to all of pixel regions 4 of substrate 1.

With such a coating method, it is possible to precisely eject ink on pixel regions even when 1) substrate 1 as a coating target shows lot-to-lot variation in size or size variation due to thermal expansion, or 2) misalignment of the inkjet head transfer mechanism occurs during operation or misalignment of an inkjet head attachment unit occurs due to thermal expansion during operation. Moreover, the manufacturing method according to Embodiment 1 does not involve misalignment of the position of organic light-emitting layers (functional layers), and thus can provide a high-quality organic EL display free of color mixing.

(Embodiment 2)

Figure 9:
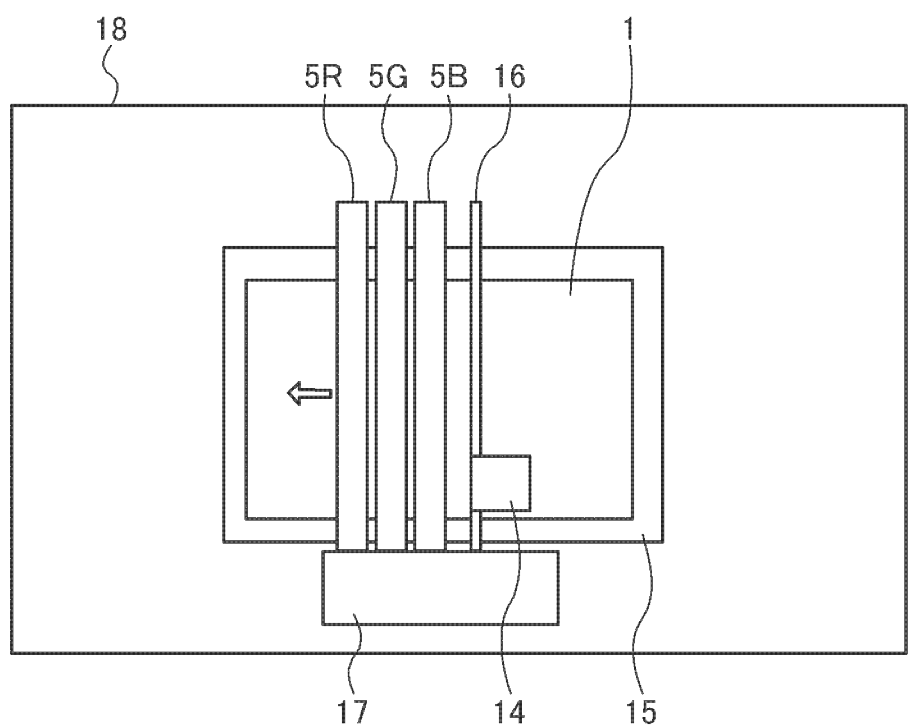
FIG. 9 is a schematic plan view illustrating an inkjet apparatus equipped with capture camera 14, as seen from the above.

Next, a manufacturing method of organic EL display according to Embodiment 2 will be described with reference to the accompanying drawings. As illustrated In FIG. 9, in the manufacturing method according to Embodiment 2, monitor camera 14 is mounted on an inkjet apparatus for checking the landing position of ink droplets 11 on substrate 1. The other aspects of the manufacturing method according to Embodiment 2 are the same as those of the manufacturing method according to Embodiment 1. The same components as those of Embodiment 1 are given the same reference signs and the description of such components is not given in Embodiment 2.

FIG. 9 is a schematic plan view of an inkjet apparatus seen from the above. Monitor camera 14 is supported by slider 16 and is movable along slider 16. Monitor camera 14 is driven by a drive system (not illustrated). Stage 15 carries substrate 1 to be coated with ink. Mount 17 supports inkjet heads 5 (5R, 5G, 5B) and monitor camera 14. Mount 18 supports the whole inkjet apparatus.

In Embodiment 2, stage 15 on which substrate 1 is placed is configured to relatively move with respect to inkjet heads 5 (5R, 5G, 5B) when applying ink 9 on substrate 1. The arrow in FIG. 9 indicates a relative movement direction of inkjet heads 5 with respect to stage 15.

The configuration of substrate 1 in Embodiment 2 is the same as that of Embodiment 1. The positional relationship between substrate 1 and inkjet heads 5 (5R, 5G, 5B) of an inkjet apparatus, and the movement direction of inkjet heads 5 are also the same as those in Embodiment 1. Moreover, the arrangement of nozzles 6 of inkjet heads 5 is the same as that in Embodiment 1.

As with the manufacturing method according to Embodiment 1, in the manufacturing method according to Embodiment 2, ink is applied on pixel regions 4 of substrate 1 and land ink droplets 11 are applied on regions adjacent thereto (see FIGS. 7 and 8). In Embodiment 2, the landing position 13 of ink droplets 11 is then monitored by monitor camera 14 (see FIG. 9). The amount of deviation of the landing position 13 monitored by monitored camera 14 from the set ink landing position (set landing position 12) is measured. More specifically, the amount of deviation of the landing position 13 from the set landing position 12 with respect to the scanning direction is measured, for example.

Based on the deviation of the ink landing position 13 from the set landing position 12, the timing of ink ejection on the next pixel region 4 is corrected. By repeating this operation, ink can be precisely applied to all of pixel regions 4 of substrate 1. As a result, it is possible to precisely apply ink on all pixel regions 4 of substrate 1 even when 1) substrate 1 as a coating target shows lot-to-lot variation in size or size variation due to thermal expansion, and 2) misalignment of the inkjet head transfer mechanism occurs during operation or misalignment of an inkjet head attachment unit occurs due to thermal expansion during operation. Moreover, measurement of the deviation by monitor camera 14 permits the rapid and accurate correction of the ink ejection timing.

(Embodiments 3 and 4)

Figure 10A:
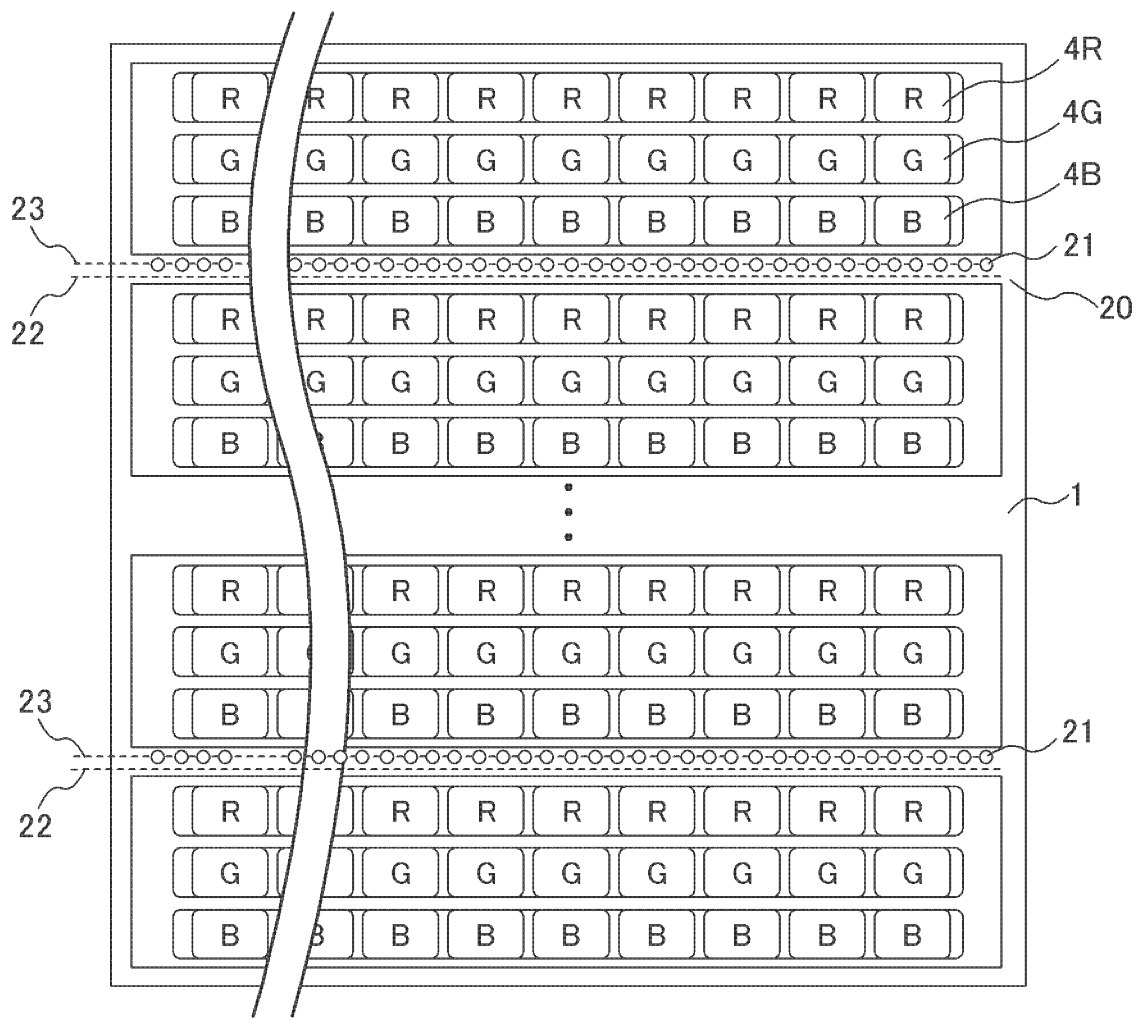
FIG. 10A is a plan view of a substrate of an organic EL display, showing ink droplets landed between groups of pixel regions 4.
Figure 10B:
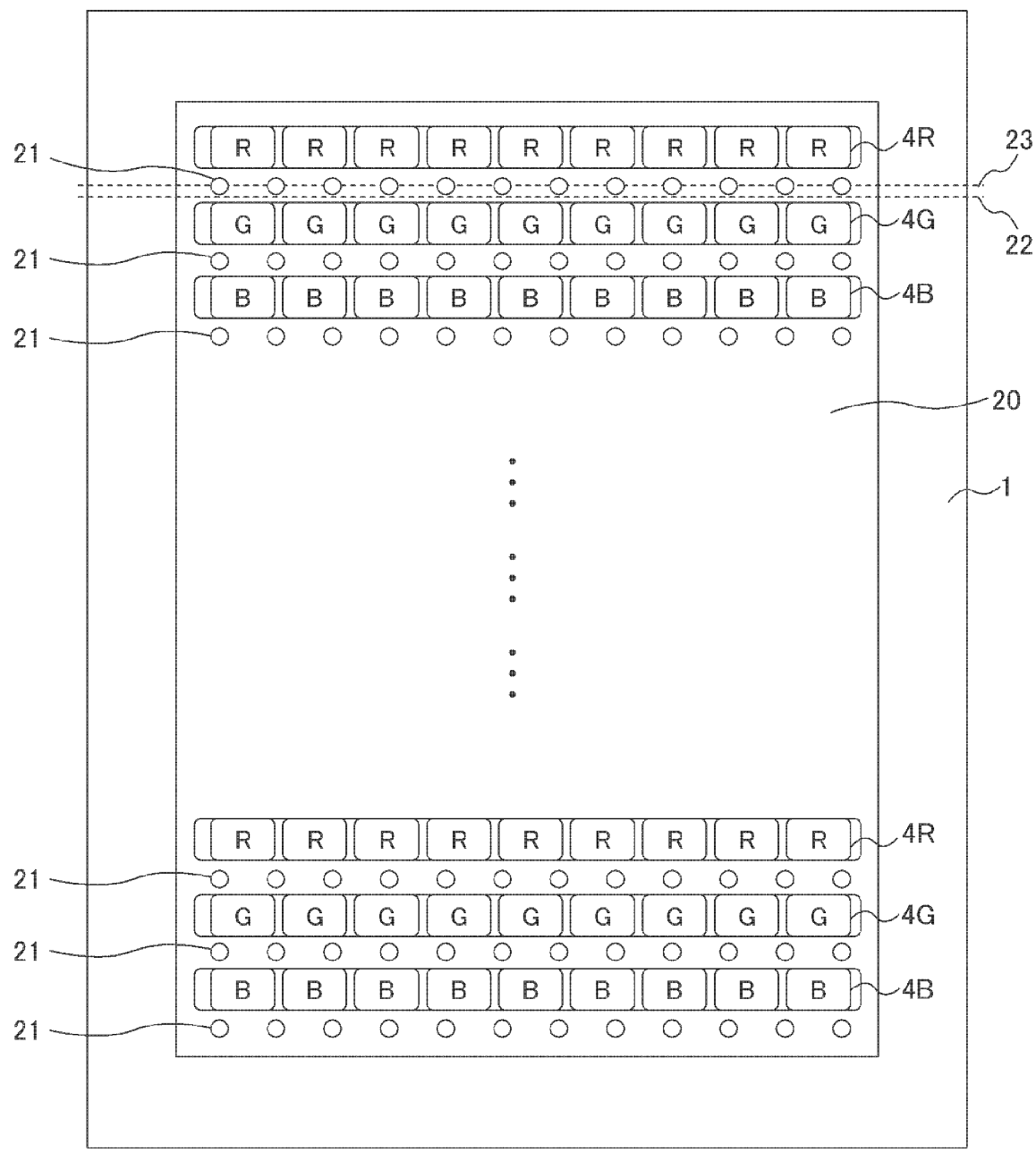
FIG. 10B is a plan view of a substrate of an organic EL display, showing ink droplets landed between adjacent pixel regions 4.

Hereinafter, manufacturing methods of organic EL display according to Embodiments 3 and 4 will be described with reference to the accompanying drawings. As illustrated in FIGS. 10A and 10B, the manufacturing methods according to Embodiments 3 and 4 eject ink droplets 11 on regions bank 3 adjacent to the widthwise ends of pixel region 4. The other aspects of the manufacturing methods according to Embodiments 3 and 4 are the same as those of the manufacturing method according to Embodiment 1. The same components as those of Embodiments 1 and 2 are given the same reference signs and the description of such components is not given in Embodiments 3 and 4.

More specifically, in Embodiment 3 where pixel regions 4R and 4G and 4B are grouped into sets of three, ink droplets 21 are landed on a lyophobic portion between each group of pixel regions 4 (FIG. 10A), the lyophobic portion being bank region 20 made of the same material as bank. On the other hand, in Embodiment 4, ink droplets 21 are landed on bank region 20 as lyophobic portion between each of adjacent pixel regions 4 (FIG. 10B).

As illustrated in FIGS. 10A and 10B, on substrate 1, bank region 20 made of bank material is arranged between each of the pixel regions 4 or groups of pixel regions 4. On bank region 20, ink droplets 21 are aligned along landing position 23. Ink droplets 21 may be any of red ink, green ink and blue ink. In FIGS. 10A and 10B, set ink position 22 at which ink droplets 21 should land is also illustrated. It can be seen in FIGS. 10A and 10B that landing position 23 deviates from set landing position 22 with respect to the scanning direction.

The configuration of substrate 1 in Embodiments 3 and 4 is the same as that of Embodiment 1. The positional relationship between substrate 1 and inkjet heads 5 (5R, 5G, 5B) of an inkjet apparatus, and the movement direction of inkjet heads 5 are also the same as those in Embodiment 1. Moreover, the arrangement of nozzles 6 of inkjet heads 5 is the same as that in Embodiment 1. The inkjet apparatus includes monitor camera 14 as in Embodiment 2 (FIG. 9).

In the manufacturing methods according to Embodiments 3 and 4, inks (R, G and B) are applied one after another on pixel regions 4 (4R, 4G and 4B), respectively, along the movement direction of inkjet heads 5. Once ink has been applied in the first pixel region 4, as illustrated in FIG. 10A or 10B, ink droplets 21 are landed on bank region 20 along a line before coating the second pixel region 4. An image of the line of ink droplets 21 is then taken by monitor camera 14 such as that illustrated in FIG. 9 to confirm the landing position 23 of ink droplets 21. The amount of deviation of the landing position 23 from the set landing position 22 is measured. For example, the deviation amount is measured in terms of the scanning direction.

When it is confirmed that any deviation has occurred with regard to the ink landing position, then the timing of ink ejection on the next second pixel region 4 is corrected based on the deviation amount. In this way the ink ejection timing is corrected while coating substrate 1. As a result, ink can be precisely applied on pixel regions 4 even when 1) substrate 1 as a coating target shows lot-to-lot variation in size or size variation due to thermal expansion, and 2) misalignment of the inkjet head transfer mechanism occurs during operation or misalignment of an inkjet head attachment unit occurs due to thermal expansion during operation. It is thus possible to form functional layers free of color mixing.

In Embodiments 3 and 4, ink droplets 21 used to measure the amount of coating position misalignment are landed on bank region 20 between pixel regions 4. Thus, unlike Embodiments 1 and 2, a larger area of substrate 1 is available for display area. In particular, an organic EL display in which pixel regions 4R, 4G and 4G are grouped into sets of three is sometimes designed to have a larger bank region between each group. In Embodiment 3 (FIG. 10A), it is only necessary to land ink droplets 21 in such large bank regions, and therefore, a larger area of substrate 1 is available.

(Embodiment 5)

In Embodiment 5, a plurality of organic EL displays is manufactured from one substrate. The technique of manufacturing multiple displays from one substrate is called "multiple display production" in some cases.

Figure 11:
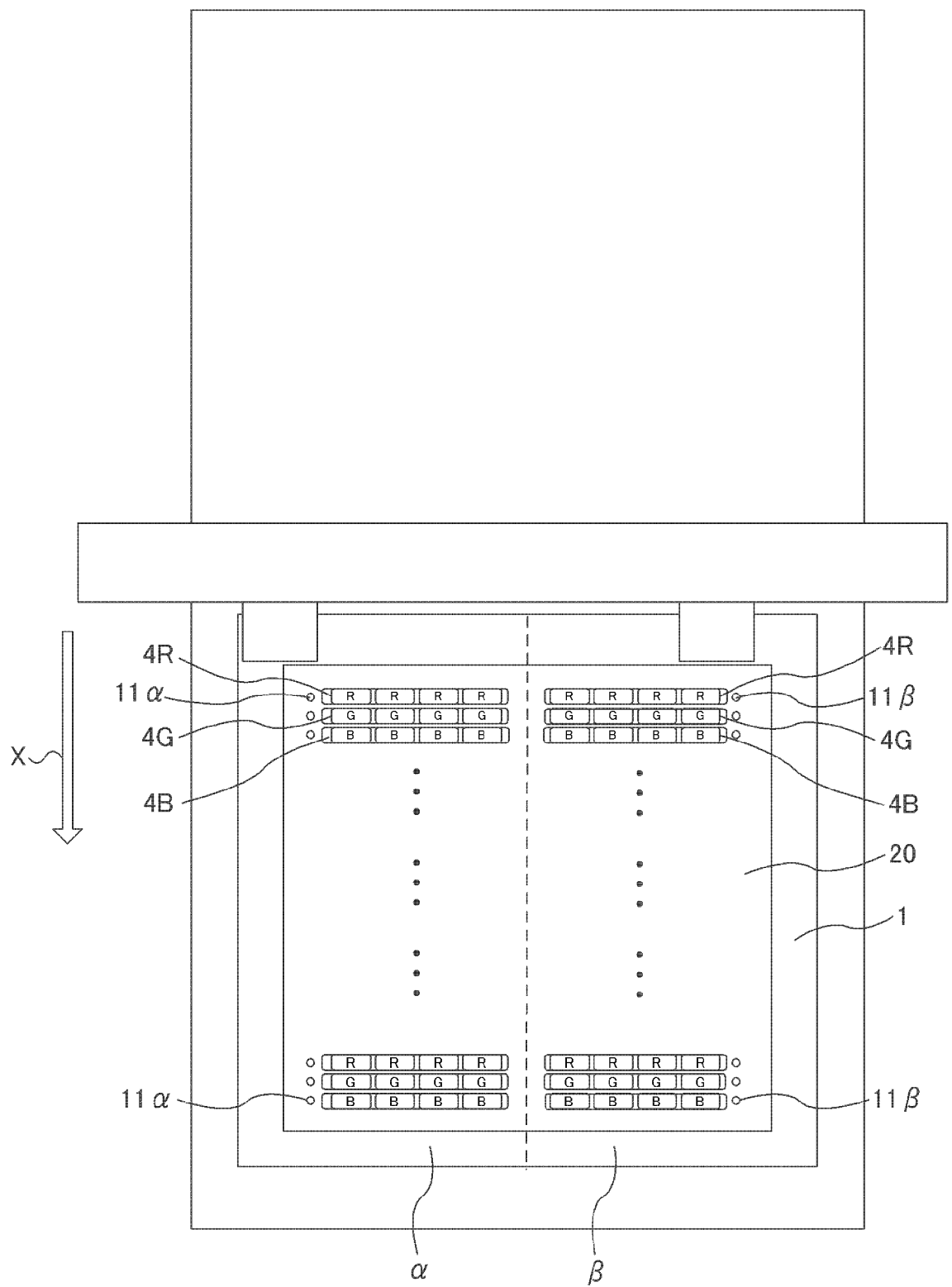
FIG. 11 illustrates how ink is applied when manufacturing two organic EL displays (α and β) from one substrate.

FIG. 11 illustrates a state where two organic EL displays (α and β) are manufactured from one substrate. The two organic EL displays are manufactured from substrate 1, one from the right half and the other from the left half. FIG. 11 illustrates a state where ink has been applied on pixel regions 4 of each display. Pixel regions 4 (4R, 4G and 4B) of each display are linear pixel regions. Pixel region 4R, 4G or 4B includes a plurality of sub-pixels emitting light of the same color (R, G or B). Lines of pixel regions 4R, 4G or 4B of one organic EL display α are aligned with lines of pixel regions 4R, 4G or 4B of the other organic EL display β, respectively.

The substrate illustrated in FIG. 11 is obtained by sequentially applying ink on respective pixel regions 4 on substrate 1 while relatively moving inkjet head 5 with respect to substrate 1 in the direction indicated by an arrow. At this time, ink droplet 11a is landed on the bank at a position adjacent to one of the lengthwise ends of each pixel region 4 of organic EL display α, and ink droplet 11β is landed on the bank at a position adjacent to one of the lengthwise ends of each pixel region 4 of organic EL display β. Thus, there is no need to eject ink droplet 11 on bank regions adjacent to either lengthwise end of each of pixel regions of each organic EL display.

(Embodiment 6)

Next, a manufacturing method of organic EL display according to Embodiment 6 will be described with reference to the accompanying drawings. Pixel regions 4 in Embodiments 1 to 5 are linear regions defined by linear banks 3, and include therein a plurality of sub-pixels (R, G or B). By contrast, pixel regions 4 (4R, 4G and 4B) in Embodiment 6 are regions separated from one another by banks 3 (single pixel regions), each including therein one sub-pixel (FIG. 12).

Figure 12:
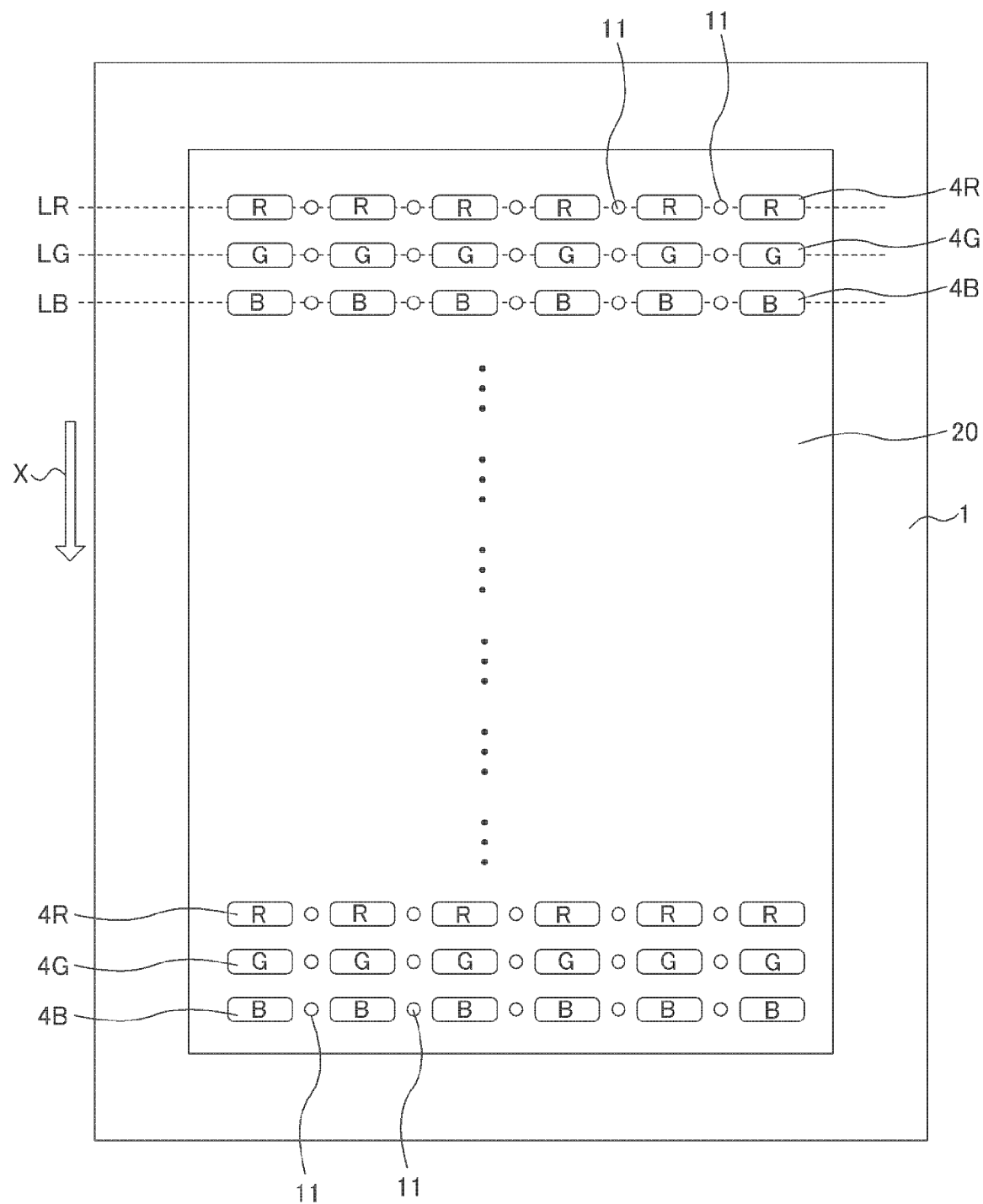
FIG. 12 illustrates how ink is applied on a substrate provided with single pixel regions 4.

As illustrated in FIG. 12, pixel regions 4 in Embodiment 6 are partitioned by banks 20 on a sub-pixel (R, G, B) basis. Substrate 1 illustrated in FIG. 12 includes pixel line LR in which pixel regions 4R each containing one sub-pixel R emitting red light are aligned; pixel line LG in which pixel regions 4G each containing one sub-pixel G emitting green light are aligned; and pixel line LB in which pixel regions 4B each containing sub-pixel B emitting blue light are aligned.

In Embodiment 6, ink is sequentially applied on respective pixel regions 4 while relatively moving inkjet head 5 with respect to substrate 1 in the direction indicated by arrow X. Upon applying ink on pixel regions 4 aligned on a certain pixel line L (LR, LG or LB), ink droplets 11 are also landed on bank regions between adjacent pixel regions 4. The amount of deviation of the landing position of ink droplets 11 from the set landing position is then measured.

The timing of ink ejection on pixel regions 4 aligned on the next pixel line L is corrected based on the deviation amount. As a result, ink can be precisely applied on pixel regions 4. By repeating this operation, ink can be precisely applied on all pixel regions 4 even when 1) substrate 1 shows lot-to-lot variation in size or size variation due to thermal expansion, and 2) when misalignment of the inkjet head transfer mechanism occurs during operation or misalignment of an inkjet head attachment unit occurs due to thermal expansion during operation. It is thus possible to form functional layers free of color mixing.

(Embodiment 7)

Figure 13:
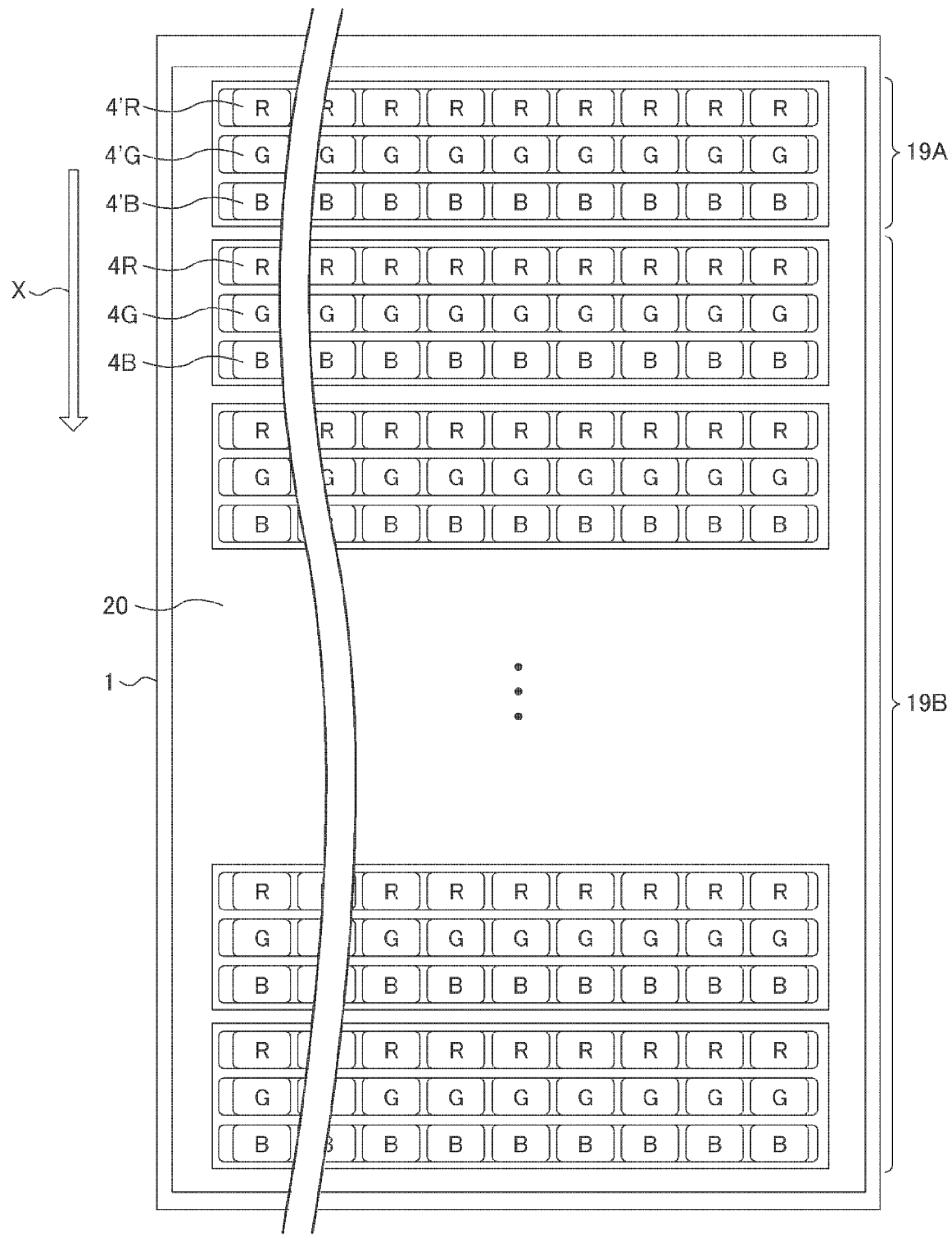
FIG. 13 is a plan view of a substrate provided with non-luminescent region 19A.

Next, a manufacturing method of organic EL display according to Embodiment 7 will be described with reference to the accompanying drawings. In the manufacturing method according to Embodiment 7, luminescent region 19B and non-luminescent region 19A are provided on substrate 1 as illustrated in FIG. 13. The other aspects of the manufacturing methods according to Embodiment 7 are the same as those of the manufacturing method according to Embodiments 1 and 2. The same components as those of Embodiments 1 and 2 are given the same reference signs and the description of such components is not given in Embodiment 7.

FIG. 13 is a plan view of substrate 1 that has luminescent region 19B including a plurality of pixel regions 4 (4R, 4G, 4B), and non-luminescent region 19A including a plurality of dummy pixel regions 4' (4'R, 4'G, 4'B). Non-luminescent region 19A is arranged at the periphery of luminescent region 19B on substrate 1. Specifically, non-luminescent region 19A is positioned upstream of luminescent region 19B with respect to moving direction X of the inkjet head.

The configuration of organic EL devices contained in substrate 1 is the same as that of organic EL devices contained in substrate 1 in Embodiment 1. The configuration of the inkjet apparatus is the same as that of the inkjet apparatus in Embodiments 1 and 2. The positional relationship between substrate 1 and inkjet heads 5 (5R, 5G, 5B) of an inkjet apparatus, and the movement direction of inkjet heads 5 are also the same as those in Embodiment 1. Moreover, the arrangement of nozzles 6 of inkjet heads 5 is the same as that in Embodiment 1. The inkjet apparatus includes monitor camera 14 as in Embodiment 2 (FIG. 9).

In the coating process according to Embodiment 7, ink is first applied on dummy pixel regions 4' (4'R, 4'G, 4'B) in non-luminescent region 19A and then on pixel regions 4 (4R, 4G, 4B) in luminescent region 19B.

Upon ejecting ink on dummy pixel regions 4', ink droplets 11 are also landed on regions bank 3 adjacent to either end of each dummy region 4' (see FIG. 8). An image of ink droplets 11 landed outside dummy pixel regions 4' is taken by monitor camera 14 such as that illustrated in FIG. 9 to confirm the landing position 13 of ink droplets 11. The amount of deviation of landing position 13 from set landing position 12 is then measured (see FIG. 8). For example, the deviation amount is measured in terms of the scanning direction.

When it has been confirmed that any deviation has occurred with regard to ink landing position, then the timing of ink ejection on the next second pixel region 4 in luminescent region 19B is corrected based on the deviation. In this way, the ink ejection timing is corrected while coating substrate 1. As a result, ink can be precisely applied on pixel regions 4 even when 1) substrate 1 shows lot-to-lot variation in size or size variation due to thermal expansion, and 2) misalignment of the inkjet head transfer mechanism occurs during operation or misalignment of an inkjet head attachment unit occurs due to thermal expansion during operation. With the manufacturing method according to Embodiment 7, misalignment of films such as functional films like organic light-emitting layers does not occur, making it possible to provide a high-quality organic EL display free of color mixing.

In addition, in the manufacturing method according to Embodiment 7, ink is first applied in dummy pixel regions 4' in non-luminescent region 19A, and at that time, ink droplets 11 are landed on regions adjacent to either end of each dummy pixel region 4'. Ink is then applied on pixel regions in luminescent region 19B while correcting the ink ejection timing based on the landing position of ink droplets 11, whereby in Embodiment 7 ink may be more precisely applied on pixel regions 4 compared to other Embodiments.

(Embodiment 8)

In Embodiment 8, a coated substrate is inspected for measuring the amount of deviation of the ink landing position from the set landing position, followed by correction of the ink ejection timing for coating of another substrate, based on the deviation amount measured.

Figure 14A:
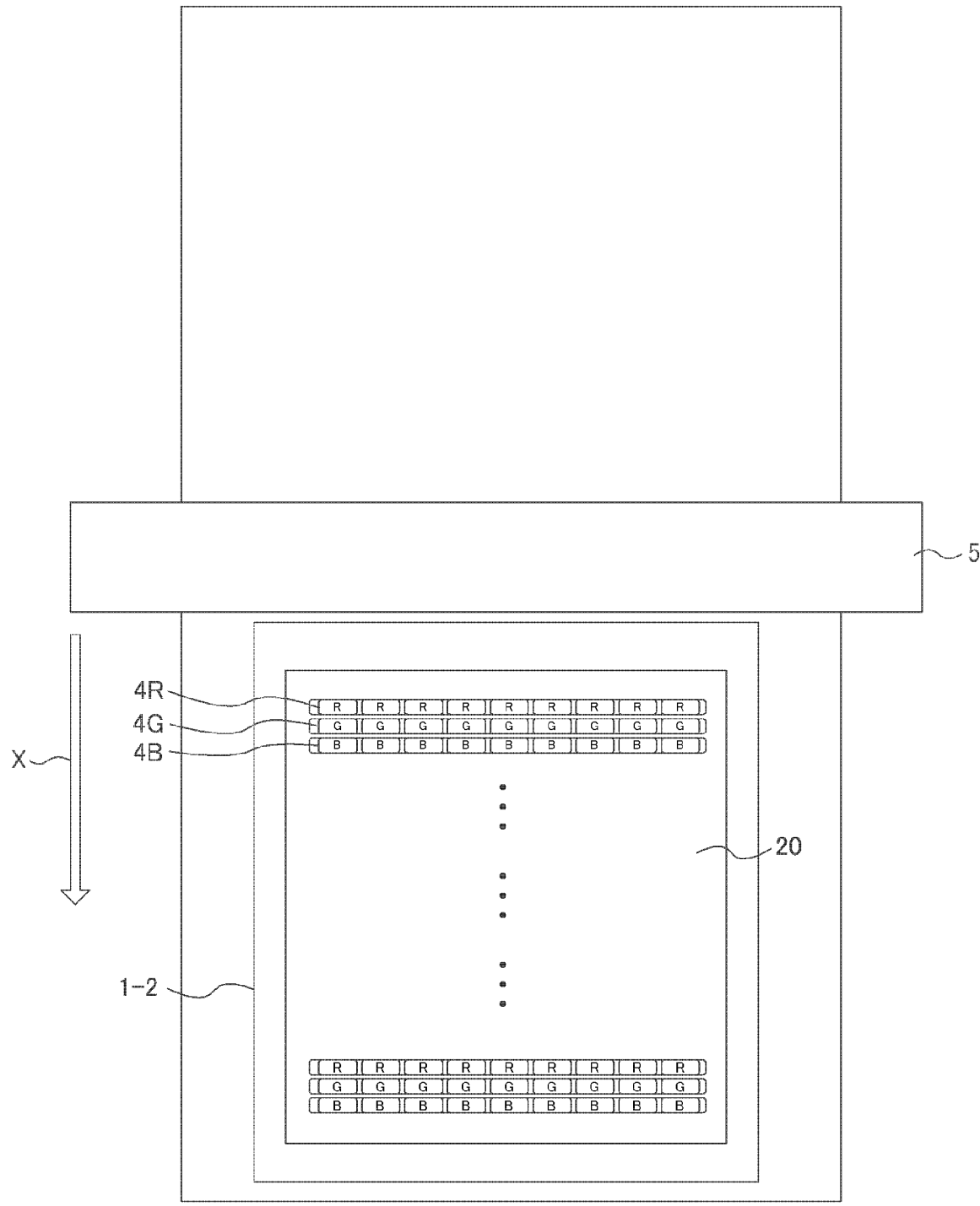
FIG. 14A illustrates a coating operation on a substrate by means of an inkjet apparatus.
Figure 14B:
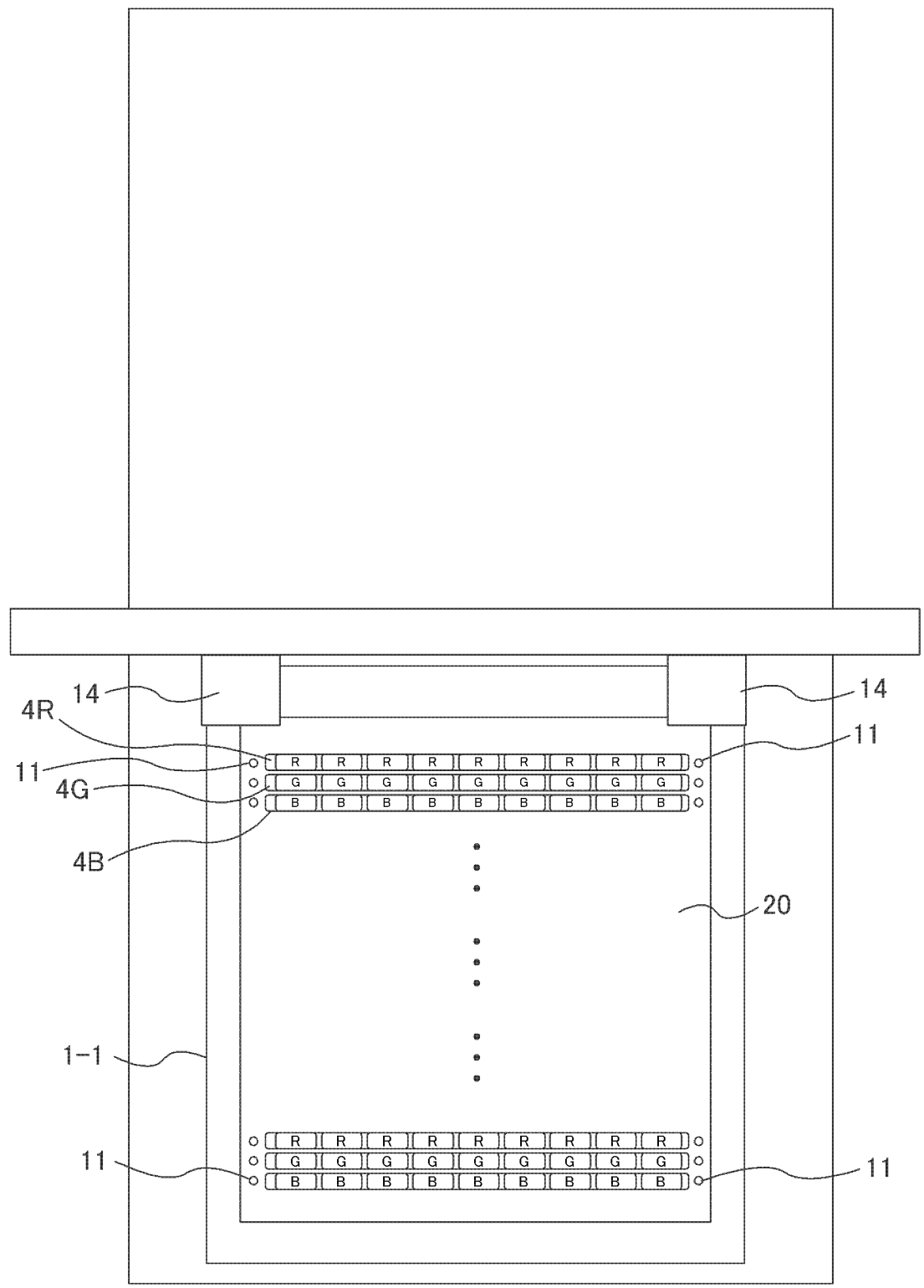
FIG. 14B illustrates how a coated substrate is inspected.
Figure 15:
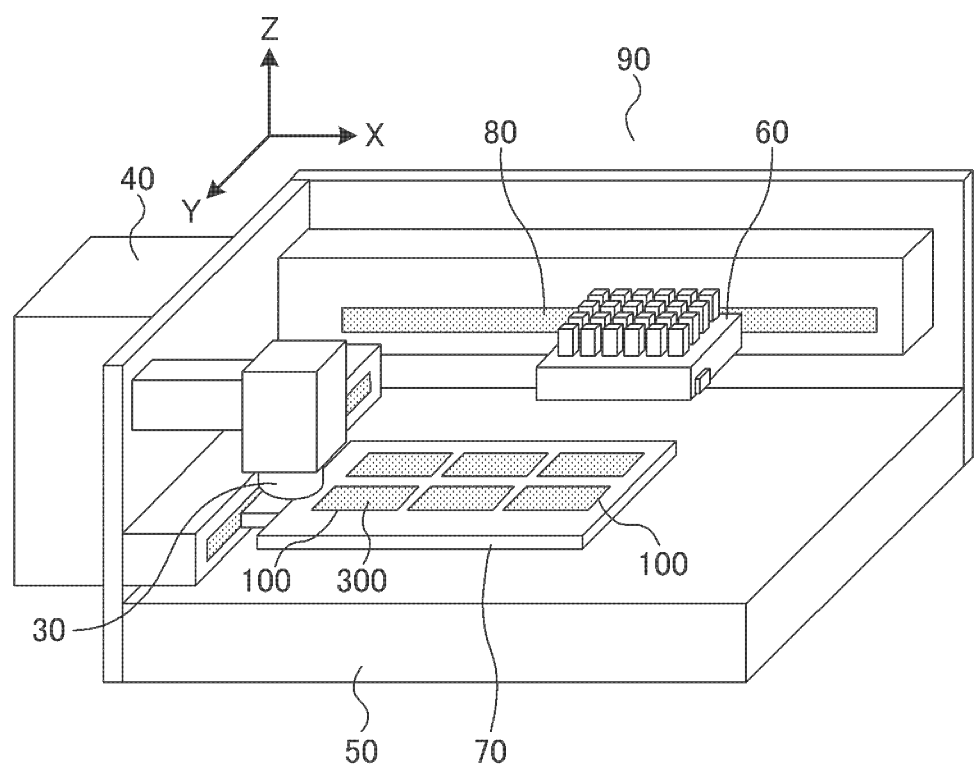
FIG. 15 is a schematic perspective view of a conventional inkjet coater.

FIG. 14A illustrates a state where substrate 1-2 is being coated using an inkjet apparatus equipped with inkjet head 5. FIG. 14B illustrates a state where the condition of ink applied on substrate 1-1 is being observed with an inspection apparatus equipped with monitor camera 14.

First, as in Embodiment 1, ink is applied on pixel regions 4 of substrate 1-1 with an inkjet apparatus while landing ink droplets 11 on bank regions adjacent to pixel regions 4. After the completion of the coating operation, an inspection apparatus (equipped with monitor camera 14 as illustrated in FIG. 14B) set apart from the inkjet apparatus is used to measure the amount of deviation of landing position 13 of ink droplets 11 from set landing position 12 on coated substrate 1-1 (see FIG. 8). Monitor camera 14 captures an image of ink droplets 11.

The deviation amount measured with the inspection apparatus illustrated in FIG. 14B is then fed back to the inkjet apparatus (see FIG. 14A) which is ready to apply ink on pixel regions 4 of non-coated substrate 1-2. Substrate 1-2 has the same configuration as substrate 1-1. The inkjet apparatus illustrated in FIG. 14A applies ink on pixel regions 4 of substrate 1-2 while correcting the timing of ink ejection from inkjet head 5 based on the feedback information, whereby ink can be precisely applied on pixel regions 4 of substrate 1-2.

Possible coating position misalignment due to variation between different lots of substrates (substrate 1-1 and substrate 1-2) is difficult to be eliminated with the manufacturing method according to Embodiment 8. However, it is possible to precisely apply ink on pixel regions of substrates even when misalignment of the inkjet head transfer mechanism occurs during operation or misalignment of an inkjet head attachment unit occurs due to thermal expansion during operation.

Only some of the substrates coated by the inkjet apparatus may be sampled for inspection, rather than sampling all of the coated substrates. This allows for precise coating of many substrates in shorter time.

Preferred embodiments of the present invention have been described above. It will be understood by those skilled in the art that the present invention is by no means limited to the specific embodiments or the manufacturing process described above, and that various changes in form and modifications may be made therein without departing from the spirit and scope of the invention.

For example, although ink droplets are landed on every bank region adjacent to pixel regions 4 of substrate 1 in the above embodiments, ink droplets may be landed on only some of such bank regions. For example, ink droplets may be landed only on bank regions adjacent to pixel regions 4 provided upstream with respect to the movement direction of the inkjet head. Alternatively, pixel regions 4 may be selected from those provided upstream, midstream and downstream with respect to the movement direction of the inkjet head, and ink droplets may be landed only on bank regions adjacent to the selected pixel regions 4.

For example, although ink droplets 11 are landed on bank regions adjacent to either lengthwise end of each linear pixel region 4 in Embodiment 1 and other embodiments, ink droplets 11 may be landed only on one of the two the bank regions for each pixel region 4. In particular, when the parallelism between the nozzle row of inkjet head 5 and the line of linear bank 3A of substrate 1 is well controlled, for achieving sufficient effects, it is only necessary to apply ink droplets on one of the two bank regions adjacent to either lengthwise end of each pixel region 4.

In the embodiments given above, all pixel regions 4 on substrate 1 are coated in a single scanning pass of inkjet heads 5. However, when the length of inkjet heads 5R, 5G and 5B is shorter than the length of substrate 1, inkjet heads 5 may relatively reciprocate with respect to substrate 1, making several scanning passes to complete the coating of all pixel regions 4 of substrate 1.

INDUSTRIAL APPLICABILITY

With the inkjet coating method of the embodiments of the present invention, it is possible to correct coating position misalignment caused by lot-to-lot variation in substrate size or substrate size variation due to thermal expansion, as well as coating position misalignment caused by misalignment of parts of the inkjet coater itself. In particular, with the inkjet coating method of the present invention, it is possible to precisely apply ink even on large size substrates, which show lot-to-lot variation in size or large size variation due to thermal expansion. Thus, the inkjet coating method of the embodiments of the present invention is suitably used in a process for forming functional layers by coating techniques, contributing to provide a high-quality, large-size organic EL display.

REFERENCE SIGNS LIST

X Scanning Direction
1, 1-1, 1-2 Substrate
2 Base Substrate
3 Bank
3A Linear Bank
4, 4R, 4G, 4B Pixel Region
5, 5R, 5G, 5G Inkjet Head
6 Nozzle
9 Ink
10 Pixel Regulation Layer
11, 11α, 11β Liquid Ink Droplet
12 Set Ink Landing Position
13 Actual Ink Landing Position
14 Monitor Camera
15 Stage
16 Slider
17 Mount
18 Mount
19A Non-Luminescent Region
19B Luminescent Region
20 Bank Region
21 Ink Landing Position
22 Set Ink Landing Position
23 Actual Ink Landing Position
24 Hole Transport Layer
25 Interlayer
26 Organic Light-Emitting Layer
27 Electron Transport Layer
28 Cathode
29 Sealing Layer
30 Resin Layer
31 Glass Substrate
32 Polarizing Plate
40 Planarizing Film
45 Reflective Anode
50 Stage
60 Carriage
70 Table
80 Cartridge
90 Microarray Fabrication Apparatus
100 Substrate
110 Drive Control Means
120 Imaging Means
300 Test Pattern

The invention claimed is:

1. A coating method in which ink droplets containing functional material are ejected through nozzles on a substrate having a plurality of pixel regions having respective longitudinal axes parallel to each other and lyophobic portions adjacent to the respective pixel regions, to form a functional layer in each of the pixel regions, the method comprising:

landing the ink droplets on a first pixel region and on first lyophobic portions at the same time, the first lyophobic portions being positioned in a direction of the longitudinal axis of the first pixel region and positioned adjacent to both lengthwise ends of the first pixel region, and the first lyophobic portions being positioned outside of the first pixel region;

measuring a deviation of a landing position of the ink droplet on one of the first lyophobic portions from a set ink landing position which has been set in the first lyophobic portions, the set ink landing position being a relative position with respect to the first pixel region in a direction perpendicular to the longitudinal axis; and ejecting the ink droplets on a second pixel region and on second lyophobic portions of the substrate at the same time by correcting a timing of ink ejection through the nozzles based on the measured deviation, the second lyophobic portions being positioned in a direction of the longitudinal axis of the second pixel region and positioned adjacent to both lengthwise ends of the second pixel region, and the second lyophobic portions being positioned outside of the second pixel region.

2. The coating method according to claim 1, further comprising capturing an image containing the ink droplet which landed on one of the first lyophobic portions and the first pixel region, and in the measuring, the deviation is measured using the captured image.

3. The method according to claim 1, wherein the first pixel region includes at least one sub-pixel.

4. The coating method according to claim 1, wherein the first pixel region is a linear region including a plurality of sub-pixels to which the ink is applied.

5. The coating method according to claim 1, wherein the first pixel region is a linear region including a plurality of sub-pixels to which the ink is applied, and the method further comprises measuring a deviation between a landing position of the ink droplet on one of the two lyophobic portions and a landing position of the ink droplet on the other one of the two lyophobic portions; and correcting the timing of ink ejection through the nozzles based on the measured deviation between the landing position of the ink droplet on one of the two lyophobic portions and the landing position of the ink droplet on the other one of the two lyophobic portions.

6. The coating method according to claim 1, wherein a contact angle of the ink droplet to one of the first lyophobic portions is at least 30°.

7. A manufacturing method of an organic electroluminescent (EL) display in which ink droplets containing functional material are ejected through nozzles on a display substrate having a plurality of pixel regions having respective longitudinal axes parallel to each other and lyophobic portions adjacent to the respective pixel regions, to form an organic functional layer in each of the pixel regions, the method comprising:

landing the ink droplets on a first pixel region and on first lyophobic portions at the same time, the first lyophobic portions being positioned in a direction of the longitudinal axis of the first pixel region and positioned adjacent to both lengthwise ends of the first pixel region, and the first lyophobic portions being positioned outside of the first pixel region;

measuring a deviation of a landing position of the ink droplet on one of the first lyophobic portions from a set ink landing position which has been set in the first lyophobic portions, the set ink landing position being a relative position with respect to the first pixel region in a direction perpendicular to the longitudinal axis; and ejecting the ink droplets on a second pixel region and on second lyophobic portions of the substrate at the same time by correcting a timing of ink ejection through the nozzles based on the measure deviation, the second lyophobic portions being positioned in a direction of the longitudinal axis of the second pixel region and positioned adjacent to both lengthwise ends of the second pixel region, and the second lyophobic portions being positioned outside of the second pixel region.

8. The manufacturing method according to claim 7, further comprising capturing an image containing the ink droplet which landed on one of the first lyophobic portions and the first pixel region, and in the measuring, the deviation is measured using the captured image.

9. The manufacturing method according to claim 7, wherein the first pixel region includes at least one sub-pixel.

10. The manufacturing method according to claim 7, wherein the first pixel region is a linear region including a plurality of sub-pixels to which the ink is applied.

11. The manufacturing method according to claim 7, wherein the first pixel region is a linear region including a plurality of sub-pixels to which the ink is applied, and the method further comprises measuring a deviation between a landing position of the ink droplet on one of the two lyophobic portions and a landing position of the ink droplet on the other one of the two lyophobic portions; and correcting the timing of ink ejection through the nozzles based on the measured deviation between the landing position of the ink droplet on one of the two lyophobic portions and the landing position of the ink droplet on the other one of the two lyophobic portions.

12. The manufacturing method according to claim 7, wherein a contact angle of the ink droplet to one of the first lyophobic portions is at least 30°.

* * * * *